United States Patent [19]

Saito et al.

[11] Patent Number: 5,230,981
[45] Date of Patent: Jul. 27, 1993

[54] IMAGE RECORDING PROCESS USING SILVER HALIDE, REDUCING AGENT AND PHOTOPOLYMERIZATION INITIATOR

[75] Inventors: Naoki Saito; Makoto Yamada, both of Kanagawa, Japan

[73] Assignee: Fuji Photo Film Co., Ltd., Kanagawa, Japan

[21] Appl. No.: 482,618

[22] Filed: Feb. 21, 1990

[30] Foreign Application Priority Data

Mar. 7, 1989 [JP] Japan .................................. 1-54101

[51] Int. Cl.$^5$ ............................................. G03C 1/72
[52] U.S. Cl. ..................................... 430/138; 430/264; 430/270; 430/281; 430/394; 430/917; 430/918
[58] Field of Search ............... 430/138, 264, 270, 281, 430/394, 917, 918

[56] References Cited

U.S. PATENT DOCUMENTS

| | | | |
|---|---|---|---|
| 4,649,098 | 3/1987 | Takeda . | |
| 4,861,696 | 8/1989 | Tamagawa et al. | 430/138 |
| 4,871,641 | 10/1989 | Kakimi | 430/138 |
| 4,879,200 | 11/1989 | Oka | 430/281 |
| 4,891,293 | 1/1990 | Yamada | 430/281 |

FOREIGN PATENT DOCUMENTS 0202490 11/1986 European Pat. Off. .

Primary Examiner—Jack P. Brammer
Attorney, Agent, or Firm—Sughrue, Mion, Zinn, Macpeak & Seas

[57] ABSTRACT

An image recording process is disclosed. The process comprises the steps of: imagewise exposing silver halide to light to form a latent image of the silver halide; developing the formed latent image of the silver halide with a reducing agent; and conducting substantially uniform light exposure in the presence of a photopolymerization initiator and an ethylenically unsaturated polymerizable compound to form a polymer image. According to the present invention, the reducing agent forms an oxidation product having a function as a polymerization inhibitor after the development. Thus a polymer image is formed within the area where the oxidation product of the reducing agent has not been formed. The reducing agent has the following formula [I]:

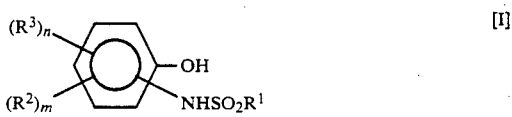

in which $R^1$ is an alkyl group, an aryl group or a heterocyclic group; $R^2$ is an organic group which is attached to the benzene ring by a hetero-atom having a lone pair of electrons; $R^3$ is a halogen atom, an alkyl group, an aryl group or a heterocyclic group; m is 1, 2, 3 or 4; n is an integer satisfying the formula, $0 \leq n \leq (4-m)$; and an aromatic ring, an aliphatic ring and/or a heterocyclic ring may be condensed with the benzene ring.

9 Claims, 5 Drawing Sheets

FIG. 1
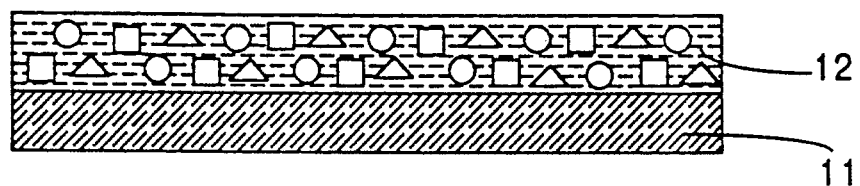
FIG. 2
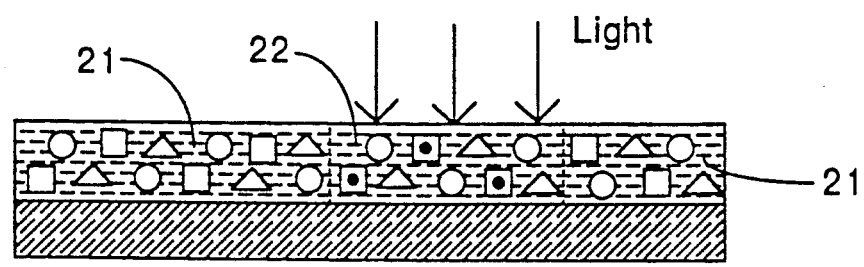
FIG. 2-a
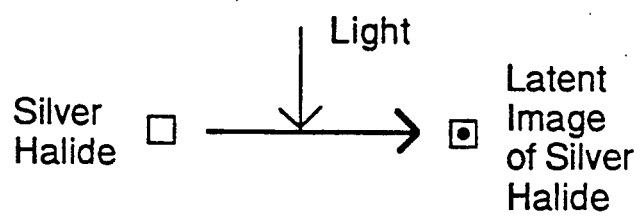

FIG. 3
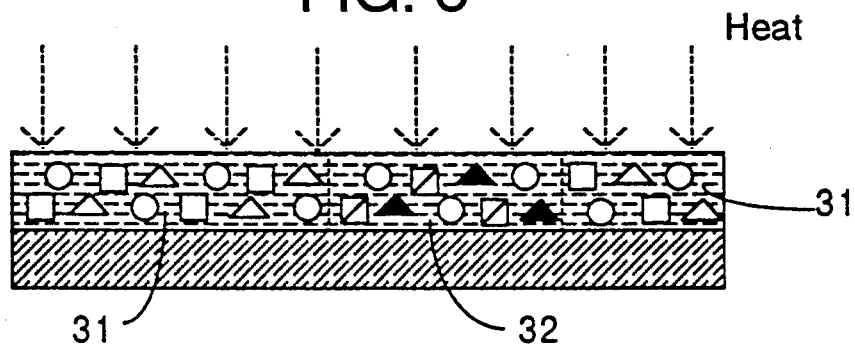
FIG. 3-a
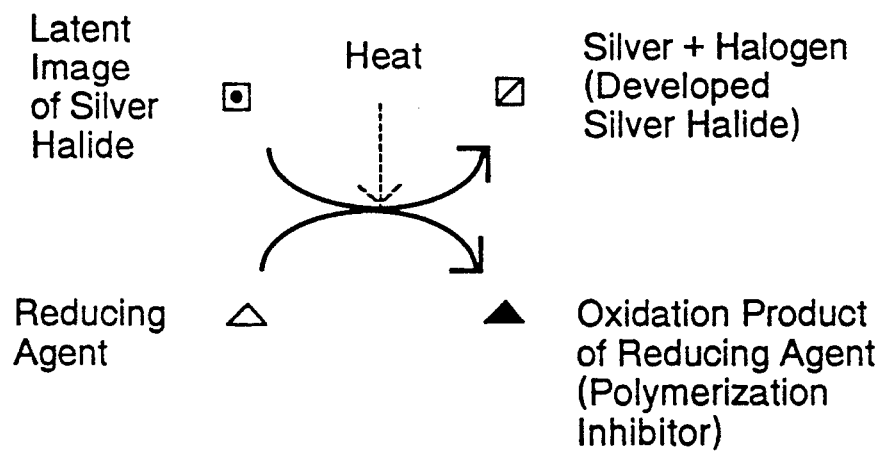
FIG. 4
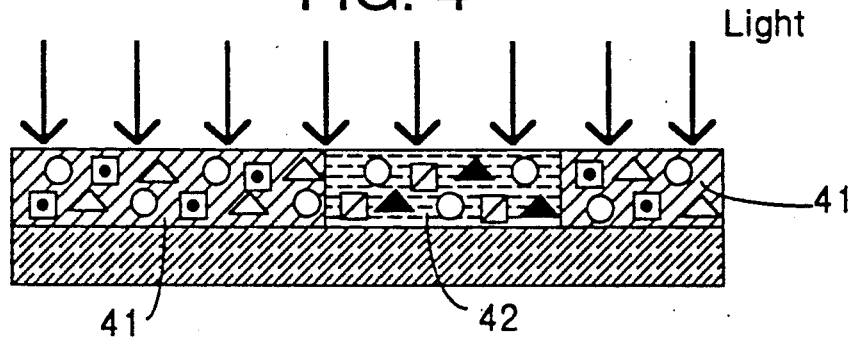

FIG. 6
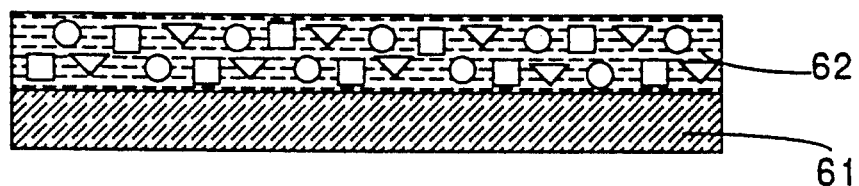
FIG. 7
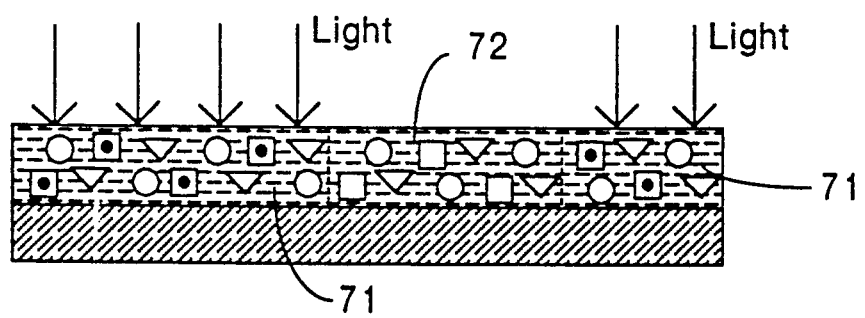
FIG. 7-a
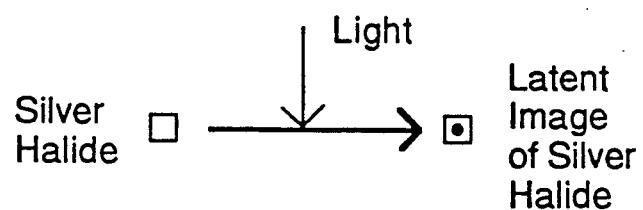

FIG. 8
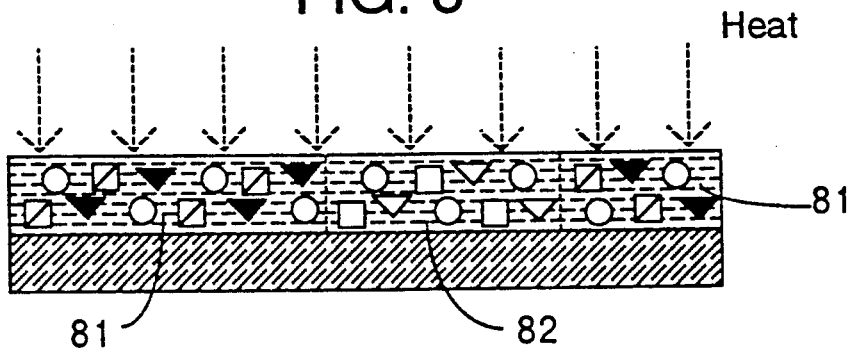
FIG. 8-a
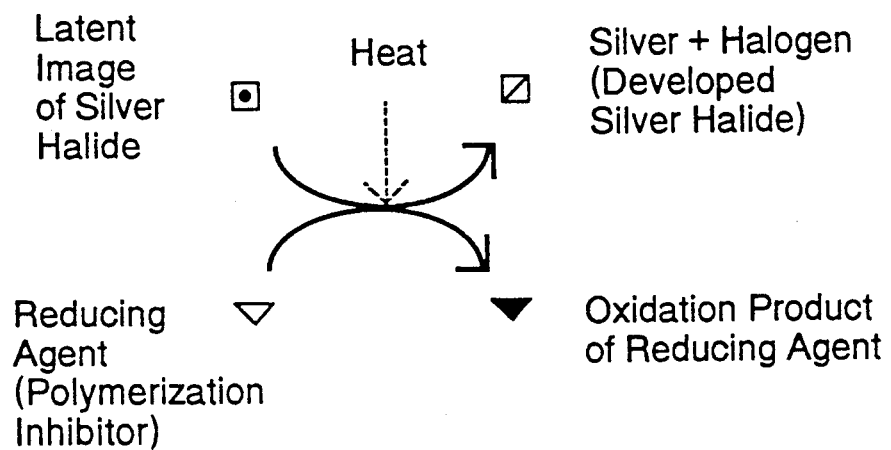
FIG. 9
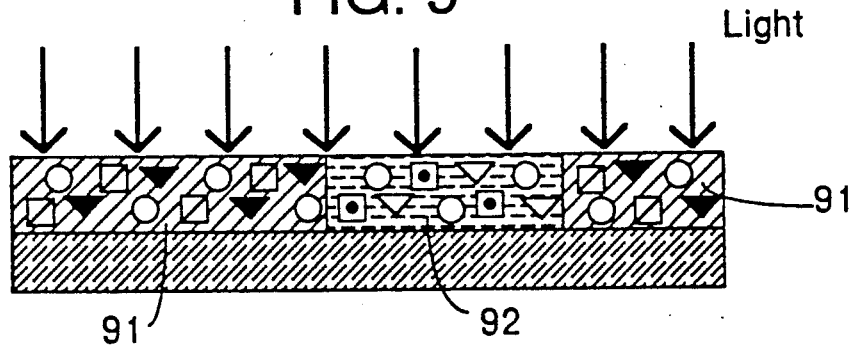

IMAGE RECORDING PROCESS USING SILVER HALIDE, REDUCING AGENT AND PHOTOPOLYMERIZATION INITIATOR

FIELD OF THE INVENTION

The present invention relates to an image recording process, which comprises the steps of: imagewise exposing silver halide to light to form a latent image of the silver halide; developing the formed latent image with a reducing agent; and conducting substantially uniform light exposure in the presence of a photopolymerization initiator and a polymerizable compound to form a polymer image.

BACKGROUND OF THE INVENTION

A process for imagewise forming a polymer image using an organic compound as a photopolymerization initiator has been well known. But, the photopolymerization initiator requires a strong light exposure or an exposure in a long term, since the sensitivity of the photopolymerization initiator is much lower than the sensitivity of silver halide. The limited sensitivity of the photopolymerization initiator restricts the use of the image recording process.

On the other hand, a process for initiating a polymerization reaction using silver halide as a light sensor has also been well known. For example, a process wherein a polymerization reaction is initiated by a radical which is formed from an oxidation product of a reducing agent in the development step of silver halide is described in Japanese Patent Publications No. 45(1970)-11149, No. 45(1970)-30338, No. 46(1971)-6581, No. 46(1971)-21723 (the contents of these three Publications are described in U.S. Pat. No. 3,697,275 and German Patent No. 1,720,665), No. 47(1972)-12638 (corresponding to U.S. Pat. No. 3,707,379 and German Patent No. 1,924,721), No. 47(1972)-14667 (corresponding to U.S. Pat. No. 3,767,400 and German Patent No. 1,797,193), No. 47(1972)-14668 (corresponding to U.S. Pat. No. 3,782,943 and German Patent No. 2,000,110), No. 47(1972)-14669 (corresponding to U.S. Pat. No. 3,697,263 and German Patent No. 1,919,841), No. 47(1972)-16357, No. 47(1972)-18585 (corresponding to U.S. Pat. No. 3,756,818 and German Patent No. 1,772,146), No. 47(1972)-20741 (corresponding to U.S. Pat. No. 3,687,667 and German Patent No. 1,936,260), No. 49(1974)-1569 (corresponding to U.S. Pat. No. 3,874,947 and German Patent No. 1,942,168), No. 49(1974)-1570 (corresponding to U.S. Pat. No. 3,756,820 and German Patent No. 1,954,768) and No. 49(1974)-10697 (corresponding to U.S. Pat. No. 3,746,542 and German Patent No. 1,961,920), and Japanese Patent Provisional Publications No. 57(1982)-138632, No. 57(1982)-142638, No. 57(1982)-176033, No. 5?(1983)-107529 (corresponding to U.S. Pat. No. 4,560,637), No. 58(1983)-169143 and No. 58(1983)-174947.

Further, Japanese Patent Publication No. 41(1966)-18862 (corresponding to U.S. Pat. No. 3,241,962) discloses a process wherein a polymerization reaction is initiated by a radical which is formed from a peroxide by a redox reaction of the peroxide with developed silver; Japanese Patent Publication No. 39(1964)-2657 (corresponding to U.S. Pat. No. 3,345,164) discloses a process wherein a polymerization reaction is initiated by a radical which is formed from a peroxide by a redox reaction of the peroxide with silver ion which remains within the unexposed area; U.S. Pat. No. 3,029,145 discloses a process wherein a polymerization reaction is initiated by a radical which is formed from a peroxide by a redox reaction of the peroxide with an iron (I) salt which remains within the unexposed area after development of silver halide with the iron (I) salt; and Japanese Patent Provisional Publication No. 55(1980)-149939 (corresponding to U.S. Pat. No. 4,287,290) discloses a process wherein a polymerization reaction is directly initiated by a reducing agent which remains within the unexposed area after development of silver halide. The above-mentioned image recording processes have a high sensitivity to form a polymer image. In theory the sensitivity of the processes corresponds to the sensitivity of silver halide. However, the processes need a wet development using a developing solution. The wet development is an obstacle to design for an image recording apparatus.

As is mentioned above, the problem of the process using a photopolymerization initiator is the low sensitivity, and the problem of the process using silver halide as a light sensor is the wet development. In order to solve both of the problems, another image recording process is proposed in Japanese Patent Provisional Publication No. 61(1986)-75342 (corresponding to U.S. Pat. No. 4,649,098). The process comprises the three steps of: (I) imagewise exposing silver halide to light to form a latent image of the silver halide; (II) developing the formed latent image of the silver halide with a reducing agent; and (III) conducting substantially uniform light exposure in the presence of a photopolymerization initiator and a polymerizable vinyl monomer (ethylenically unsaturated polymerizable compound) to form a polymer image.

The reducing agent used in the process disclosed in Japanese Patent Provisional Publication No. 61(1986)-75342 has (1) a function as a developing agent for silver halide; (2) a function as a polymerization inhibitor for the polymerizable vinyl monomer; and (3) a property of losing the function as a polymerization inhibitor after development of silver halide. Thus a polymer image is formed within the area where the reducing agent is not present (i.e., the area where the oxidation product of the reducing agent has been formed).

An embodiment of the image recording process disclosed in Japanese Patent Provisional Publication No. 61(1986)-75342 is hereinafter described in detail referring to FIGS. 6 to 9.

FIG. 6 is a sectional view schematically illustrating an embodiment of the image recording material disclosed in Japanese Patent Provisional Publication No. 61(1986)-75342.

As is shown in FIG. 6, the image recording material comprises a support (61) and an image recording layer (62). The image recording layer contains silver halide (□), a reducing agent (▽) having a function as a polymerization inhibitor, a photopolymerization initiator (○) and a polymerizable vinyl monomer (ethylenically unsaturated polymerizable compound).

FIG. 7 is a sectional view schematically illustrating the step of imagewise exposing to light the image recording material.

FIG. 7-a is a diagram showing the reaction at the step of imagewise exposing to light the image recording material.

As is shown in FIG. 7 and FIG. 7-a, the latent image of silver halide ( ) is formed within the exposed area (71). The silver halide (□) remains within the unexposed area (72).

FIG. 8 is a sectional view schematically illustrating the step of heating the image recording material.

FIG. 8-a is a diagram showing the reaction at the step of heating the image recording material.

As is shown in FIG. 8 and FIG. 8-a, the silver halide is developed (▨), and an oxidation product of the reducing agent (▼) is formed within the area (81) where the latent image of silver halide (▫) has been formed. The reducing agent (▽) having a function as a polymerization inhibitor remains within the area (82) where the latent image of silver halide has not been formed.

FIG. 9 is a sectional view schematically illustrating the step of uniformly exposing to light the image recording material.

As is shown in FIG. 9, the polymerizable compound is polymerized with the photopolymerization initiator (○) within the area (91) where the oxidation product of the reducing agent (▼), which loses the function as a polymerization inhibitor, has been formed. On the other hand, the polymerizable compound is not polymerized within the area (92) where the reducing agent (▽) having a function as a polymerization inhibitor remains.

As is described above, a polymer image is formed within the area exposed to light at the imagewise exposure according to the image recording process disclosed in Japanese Patent Provisional Publication No. 61(1986)-75342.

SUMMARY OF THE INVENTION

The present inventors have further studied the image recording process disclosed in Japanese Patent Provisional Publication No. 61(1986)-75342. As the result, the present inventors have found that it is also possible to form a polymer image within the unexposed area at the imagewise exposure.

In order to form a polymer image within the unexposed area, a reducing agent which has a property of forming an oxidation product having a function as a polymerization inhibitor after development of silver halide is necessary. The reducing agent having the property is described in Japanese Patent Provisional Publication No. 61(1986)-243449 (corresponding to European Patent Provisional Publication No. 0202490A), which relates to an image recording process using silver halide and a thermal polymerization initiator.

Japanese Patent Provisional Publication No. 61(1986)-243449 discloses examples of the reducing agent, such as 1-phenyl-3-pyrazolidone (Phenidone), 4-methyl-1-phenyl-3-pyrazolidone, 4,4-dimethyl-1-phenyl-3-pyrazolidone, 4-ethyl-1-phenyl-3-pyrazolidone, 5-methyl-1-phenyl-3-pyrazolidone, 5-phenyl-3-pyrazolidone, 5,5-dimethyl-1-phenyl-3-pyrazolidone, 4,4-dihydroxynethyl-1-phenyl-3-pyrazolidone, 4-methyl-4-hydroxymethyl-1-phenyl-3-pyrazolidone, 4,5-dimethyl-1-phenyl-3-pyrazolidone, 1-p-methoxyphenyl-3-pyrazolidone, 1-p-tolyl-3-pyrazolidone, 2-hydroxymethyl-1-phenyl-3-pyrazolidone, p-, m- or o-aminophenol, 2,6-dichloro-p-aminophenol, 2,6-dimethyl-p-aminophenol, 3,5-dimethyl-p-aminophenol, hydroquinone, methylhydroquinone, catechol, p-t-butylcatechol, chlorohydroquinone, p-methoxyphenol, p-anisidine, o-anisidine, o-, m- or p-phenylenediamine, 2,4-tolylenediamine and 3,4-tolylenediamine.

The image recording process using silver halide and a thermal polymerization initiator comprises the two steps of: (I) imagewise exposing to light a recording material containing silver halide, a reducing agent having the above-mentioned property, a polymerizable compound and a thermal polymerization initiator to form a latent image of the silver halide; and (II) heating the recording material to develop the latent image the silver halide and to thermally polymerize the polymerizable compound within the area where the oxidation product of the reducing agent (having a function as a polymerization inhibitor) has not been formed. Thus a polymer image is formed within the unexposed area.

The process using silver halide and a photopolymerization initiator (comprising the three steps) is more complicated than the process using silver halide and a thermal polymerization initiator (comprising the two steps). Therefore, the former process requires a specific reducing agent which is excellent in the above-mentioned property and the preservability. However, the reducing agents disclosed in Japanese Patent Provisional Publication No. 61(1986)-243449 do not satisfy the requirement. For the reasons mentioned above, an image recording process using silver halide and a photopolymerization initiator wherein a polymer image is formed within the unexposed area has not yet been proposed.

An object of the invention is to provide an image recording process using silver halide and a photopolymerization initiator wherein a polymer image is formed within the unexposed area.

In the course of study of the chemical structure of various reducing agents, the present inventors have found that the compound having the following formula [I] forms an oxidation product which functions as a strong polymerization inhibitor after development of silver halide. Further, the compound having the formula [I] shows an excellent stability, compared with the reducing agents disclosed in Japanese Patent Provisional Publication No. 61(1986)-243449. Using the compound having the formula [I] as the reducing agent, it is now practically possible to form a polymer image within the unexposed area in an image recording process using silver halide and a photopolymerization initiator.

There is provided by the present invention an image recording process comprising the steps of: (I) imagewise exposing silver halide to light to form a latent image of the silver halide; (II) developing the formed latent image of the silver halide with a reducing agent; and (III) conducting substantially uniform light exposure in the presence of a photopolymerization initiator and an ethylenically unsaturated polymerizable compound to form a polymer image, wherein the reducing agent forms an oxidation product having a function as a polymerization inhibitor for the polymerizable compound after the development, whereby the polymer image is formed within the area where the oxidation product of the reducing agent has not been formed, said reducing agent having the following formula [I]:

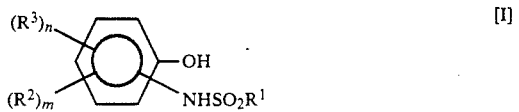

in which $R^1$ is a monovalent group selected from the group consisting of an alkyl group, an aryl group and a heterocyclic group, each of which may have one or more substituent groups; $R^2$ is an organic group which is attached to the benzene ring by a hetero-atom having a lone pair of electrons; $R^3$ is a monovalent group selected from the group consisting of a halogen atom, an alkyl group, an aryl group and a heterocyclic group, each of which may have one or more substituent groups; m is 1, 2, 3 or 4; n is an integer satisfying the formula, $0 \leq n \leq (4-m)$; and an aromatic ring, an aliphatic ring and/or a heterocyclic ring may be condensed with the benzene ring.

It is preferred that the silver halide, the reducing agent, the photopolymerization initiator and the ethylenically unsaturated polymerizable compound are contained in an image recording layer of an image recording material provided on a support.

Recently, with the progress of color hard copying, image processing such as tone modulation is in strong demand. For the purpose of the image processing, information to be copied should be converted into electric signals (digital signals). On the other hands, in the image recording process forming a polymer image, it is recently general to transfer the unpolymerized area to an image receiving material. In consideration of the above-mentioned image processing, the process wherein the polymer image is formed within the unexposed area (of the present invention) has an advantage over the process wherein the polymer image is formed within the exposed area.

The present inventors note that according to the latter process, the background area which does not contain information (i.e., white ground) is read out, and the light exposure corresponds to the background area. On the other hand, according to the former process (of the present invention), the information area is read out, and the light exposure corresponds to the information. Therefore, the process of the present invention, wherein the polymer image is formed within the unexposed area is more efficient in the light exposure than the process disclosed in Japanese Patent Provisional Publication No. 61(1986)-75342, wherein the polymer image is formed within the exposed area. The effect of the present invention is particularly remarkable, when the information to be copied is a document, which contains many characters.

Further, a laser beam is often used as a light source of the imagewise exposure when the information is converted into digital signals. Since the laser beam has a high resolving power, an exact imagewise exposure is possible even if the original of the image contains very minute lines. However, a sharp polymer image cannot be obtained when the image recording process has a low resolving power, even if the laser beam is used as a light source.

According to further study of the present inventors, it is noted that the image recording process wherein the polymer image is formed within the unexposed area has a high resolving power and can exactly express an image containing very minute lines, compared with the process wherein the polymer image is formed within the exposed area. Therefore, the image recording process of the present invention forms a sharp image. The effect of the present invention is remarkable when the laser beam is used as the light source of the imagewise exposure.

Furthermore, the compound having the formula [I] forms an oxidation product which functions as a strong polymerization inhibitor after development of silver halide. Therefore, the image recording process of the present invention using the compound as a reducing agent forms a clear image improved in contrast. Moreover, the compound having the formula [I] shows an excellent stability, compared with the reducing agents disclosed in Japanese Patent Provisional Publication No. 61(1986)-243449. Accordingly, the compound having the formula [I] can be contained in an image recording material prior to starting the image recording process.

BRIEF DESCRIPTION OF THE DRAWINGS

FIG. 1 is a sectional view schematically illustrating an embodiment of an image recording material used in the present invention.

FIG. 2 is a sectional view schematically illustrating the step of imagewise exposing to light the image recording material. FIG. 2-a is a diagram showing the reaction at the step shown in FIG. 2.

FIG. 3 is a sectional view schematically illustrating the step of heating the image recording material. FIG. 3-a is a diagram showing the reaction at the step shown in FIG. 3.

FIG. 4 is a sectional view schematically illustrating the step of uniformly exposing to light the image recording material.

FIG. 6 is a sectional view schematically illustrating an embodiment of the image recording material disclosed in Japanese Patent Provisional Publication No. 61(1986)-75342.

FIG. 7 is a sectional view schematically illustrating the step of imagewise exposing to light the image recording material. FIG. 7-a is a diagram showing the reaction at the step shown in FIG. 7.

FIG. 8 is a sectional view schematically illustrating the step of heating the image recording material. FIG. 8-a is a diagram showing the reaction at the step shown in FIG. 8.

FIG. 9 is a sectional view schematically illustrating the step of uniformly exposing to light the image recording material.

DETAILED DESCRIPTION OF THE INVENTION

Figure 5:
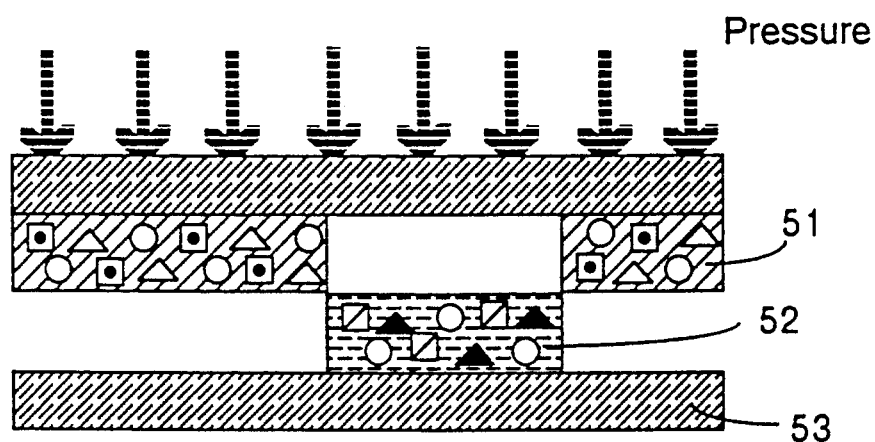
FIG. 5 is a sectional view schematically illustrating the step of pressing the image recording material on an image receiving material.

The image recording process of the present invention uses the compound having the following formula [I] as a reducing agent. Some of the compounds represented by the formula [I] are known as developing agents in the heat developable silver halide photography. But, it has not yet been known that the compound having the formula [I] forms an oxidation product which functions as a polymerization inhibitor after development of silver halide.

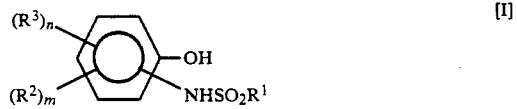

In the formula [I], $R^1$ is an alkyl group, an aryl group or a heterocyclic group. Each of the groups may have one or more substituent groups.

$R^2$ is an organic group which is attached to the benzene ring by a hetero-atom having a lone pair of electrons.

$R^3$ is a halogen atom, an alkyl group, an aryl group or a heterocyclic group. Each of the groups may have one or more substituent groups.

The "m" means 1, 2, 3 or 4.

The "n" means an integer which satisfies the formula, $0 \leq n \leq (4-m)$.

An aromatic ring, an aliphatic ring and/or a heterocyclic ring may be condensed with the benzene ring in the formula [I]. The ring condensed with the benzene ring may have one or more substituent groups. However, the benzene ring in the formula [I] has no substituent group other than $R^1$, $R^2$ and $R^3$.

Two or more compounds represented by the formula [I] may be combined with each other to form a polymer. In the case that the polymer is formed, $R^1$, $R^2$ or $R^3$ in the formula [I] preferably functions as a linking group.

The compound represented by the formula [I] is hereinafter described in more detail.

The hetero-atom having a lone pair of electrons contained in $R^2$ preferably is an element of oxygen family or nitrogen family. Examples of the hetero-atom include

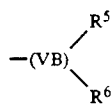

The above mark (..) means the lone pair of electrons.

In the formula [I], $R^2$ preferably is a monovalent group having the following formula [II] (the hetero-atom is an element of oxygen family) or [III] (the hetero-atom is an element of nitrogen family).

$$-(VIB)-R^4 \qquad [II]$$

In the formula [II], (VIB) is a divalent group such as oxygen, sulfur and selenium. Sulfur is particularly preferred.

$R^4$ is an alkyl group, an aryl group or a heterocyclic group. Each of the groups may have one or more substituent groups.

$$-(VB)\genfrac{}{}{0pt}{}{R^5}{R^6} \qquad [III]$$

In the formula [III], (VB) is a trivalent group such as nitrogen and phosphorus. Nitrogen is particularly preferred.

$R^5$ is hydrogen, an alkyl group, an aryl group or a heterocyclic group. Each of the groups may have one or more substituent groups.

$R^6$ is an alkyl group, an aryl group, a heterocyclic group, an acyl group, an alkylsulfonyl group, an arylsulfonyl group, an alkoxycarbonyl group, carbamoyl or sulfamoyl. An acyl group, an alkylsulfonyl group and an arylsulfonyl group are particularly preferred. Each of the groups may have one or more substituent groups.

In the formula [III], $R^6$ may be the same as $R^5$.

The halogen atom represented by $R^3$ in the formula [I] may be either fluorine, chlorine, bromine or iodine. Chlorine and bromine are particularly preferred.

The alkyl group represented by $R^1$, $R^3$, $R^4$, $R^5$ and $R^6$ preferably contains 1-22 carbon atoms. The alkyl group may be a straight chain or branched chain. The alkyl group may have a cyclic structure. Namely, the term "alkyl group" in the present specification includes a cycloalkyl group. The alkyl group may have one or more substituent groups, such as a halogen atom, an aryl group (e.g., phenyl), an alkoxy group, hydroxyl and cyano. The term "alkyl group" in the present specification further include an aralkyl group (an alkyl group substituted with an aryl group).

Examples of the aryl group represented by $R^1$, $R^3$, $R^4$, $R^5$ and $R^6$ include phenyl, naphthyl, anthryl and phenanthryl. Phenyl is particularly preferred. The aryl group may have one or more substituent groups, such as an alkyl group, an aryl group, a halogen atom, an alkoxy group, an alkoxycarbonyl group, an amido group, an alkylsulfonyl group, an arylsulfonyl group, carboxyl, an acyl group, hydroxyl, cyano, nitro, amino, carbamoyl and sulfamoyl.

Examples of the heterocyclic group represented by $R^1$, $R^3$, $R^4$, $R^5$ and $R^6$ include pyridyl, pyrimidyl, imidazolyl, thiazolyl, oxazolyl, succinimide and hydantoyl (i.e., 2,5-dioxoimidazolidyl). The heterocyclic group may be condensed with an aromatic ring (e.g., benzene ring and naphthalene ring) and/or another heterocyclic ring. The heterocyclic group may have one or more substituent groups, such as a halogen atom, an alkyl group (preferably containing 1-10 carbon atoms), an alkoxy group (preferably containing 1-10 carbon atoms) and nitro.

The "m" in the formula [I] is 1, 2, 3 or 4, and preferably is 1 or 2. When m is 2 or more, the groups represented by $R^2$ may be different from each other.

The "n" in the formula [I] is an integer which satisfies the formula, $0 \leq n \leq (4-m)$, and preferably is 0 or 1. When n is 2 or more, the groups represented by $R^3$ may be different from each other.

The acyl group represented by $R^6$ in the formula [III] has the following formula [III-a].

$$-CO-R^7 \qquad [III\text{-}a]$$

In the formula [III-a], $R^7$ is an alkyl group, an aryl group or a heterocyclic group. Each of the groups may have one or more substituent groups.

The alkylsulfonyl group and the arylsulfonyl group represented by $R^6$ in the formula [III] has the following formula [III-b].

$$-SO_2-R^8 \qquad [III\text{-}b]$$

In the formula [III-b], $R^8$ is an alkyl group or an aryl group. Each of the groups may have one or more substituent groups.

The alkoxycarbonyl group represented by $R^6$ in the formula [III] has the following formula [III-c].

$$-CO-OR^9 \qquad [III\text{-}c]$$

In the formula [III-c], $R^9$ is an alkyl group, which may have one or more substituent groups.

The carbamoyl group represented by $R^6$ in the formula [III] has the following formula [III-d].

$$-CO-NR^{10}R^{11} \qquad \text{[III-d]}$$

In the formula [III-d], each of $R^{10}$ and $R^{11}$ independently is hydrogen, an alkyl group, an aryl group or a heterocyclic group. Each of the groups may have one or more substituent groups.

The sulfamoyl group represented by $R^6$ in the formula [III] has the following formula [III-e].

$$-SO_2-NR^{12}R^{13} \qquad \text{[III-e]}$$

In the formula [III-3], each of $R^{12}$ and $R^{13}$ independently is hydrogen, an alkyl group, an aryl group or a heterocyclic group. Each of the groups may have one or more substituent groups.

The alkyl group, the aryl group and the heterocyclic group represented by $R^7$ to $R^{13}$ in the formulas [III-a], [III-b], [III-c], [III-d] and [III-e] and the substituent groups thereof have the same meanings as the alkyl group, the aryl group, the heterocyclic group and the substituent groups thereof represented by $R^1$, $R^3$, $R^4$, $R^5$ and $R^6$, respectively.

Examples of the reducing agent used in the present invention are described hereinafter.

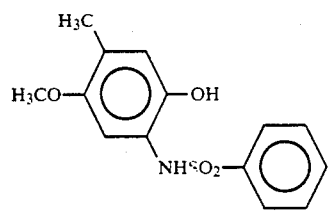
(1)

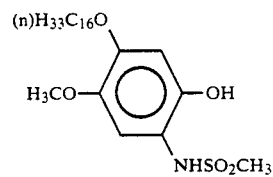
(2)

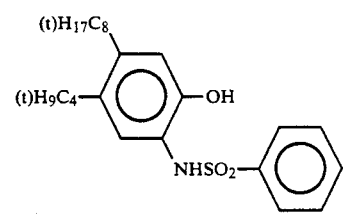
(3)

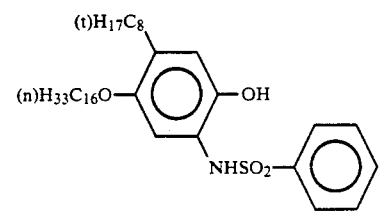
(4)

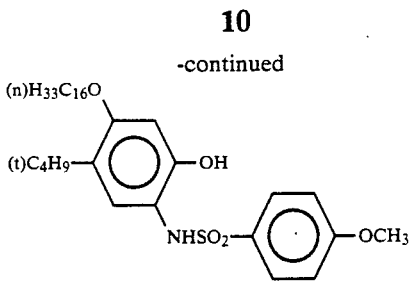
(5)

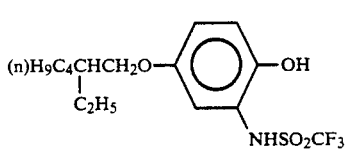
(6)

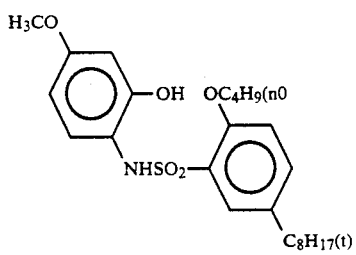
(7)

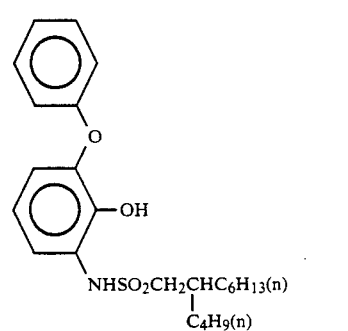
(8)

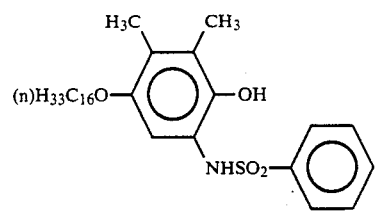
(9)

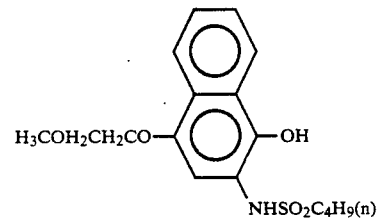
(10)

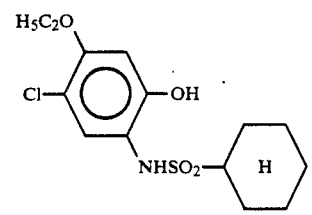
(11)

-continued
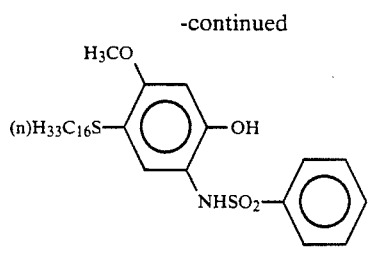 (12)
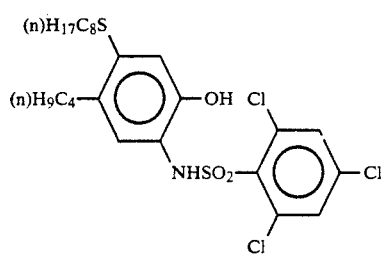 (13)
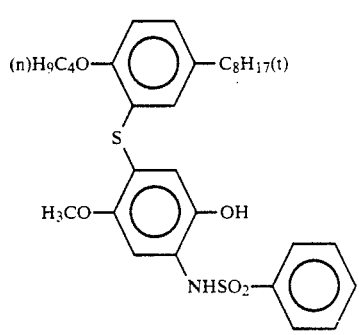 (14)
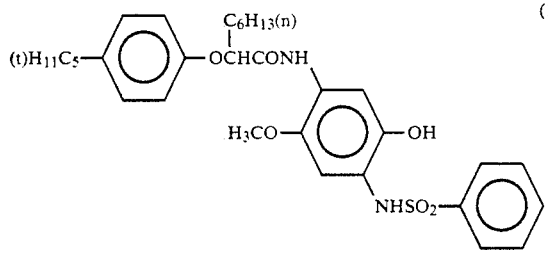 (15)
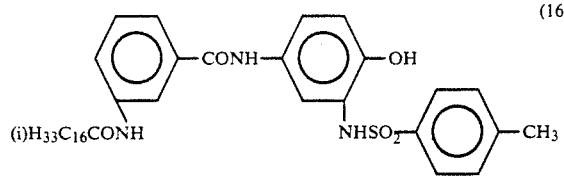 (16)
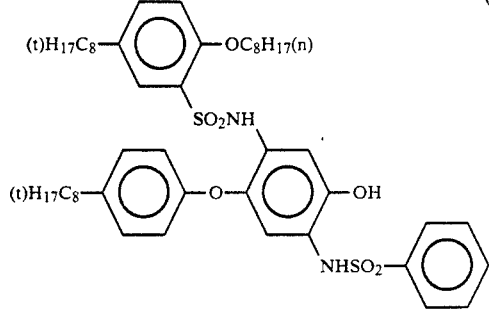 (17)
-continued
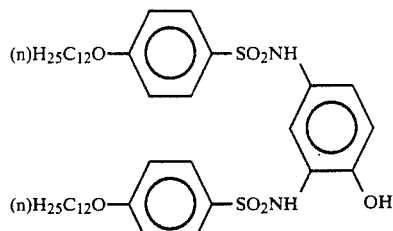 (18)
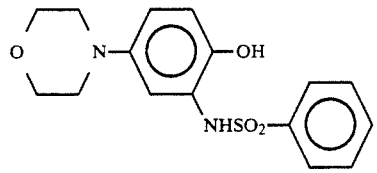 (19)
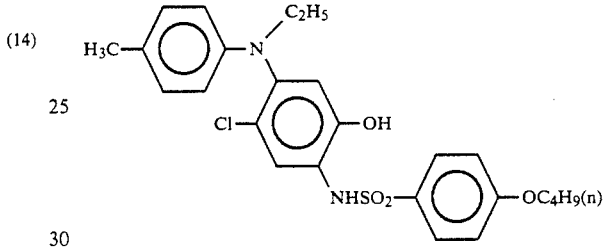 (20)
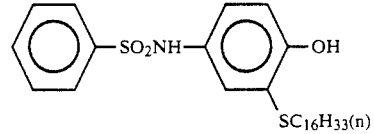 (21)
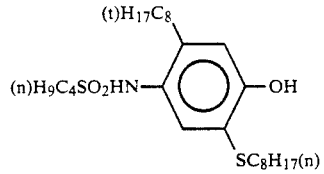 (22)
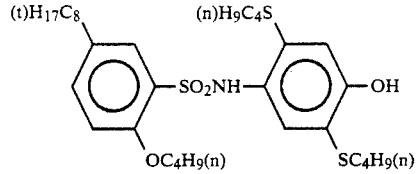 (23)
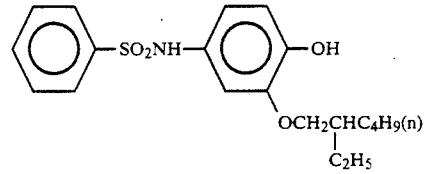 (24)
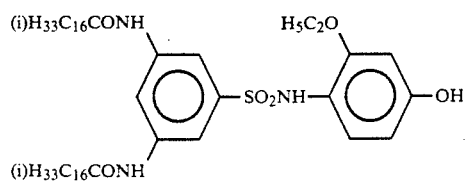 (25)

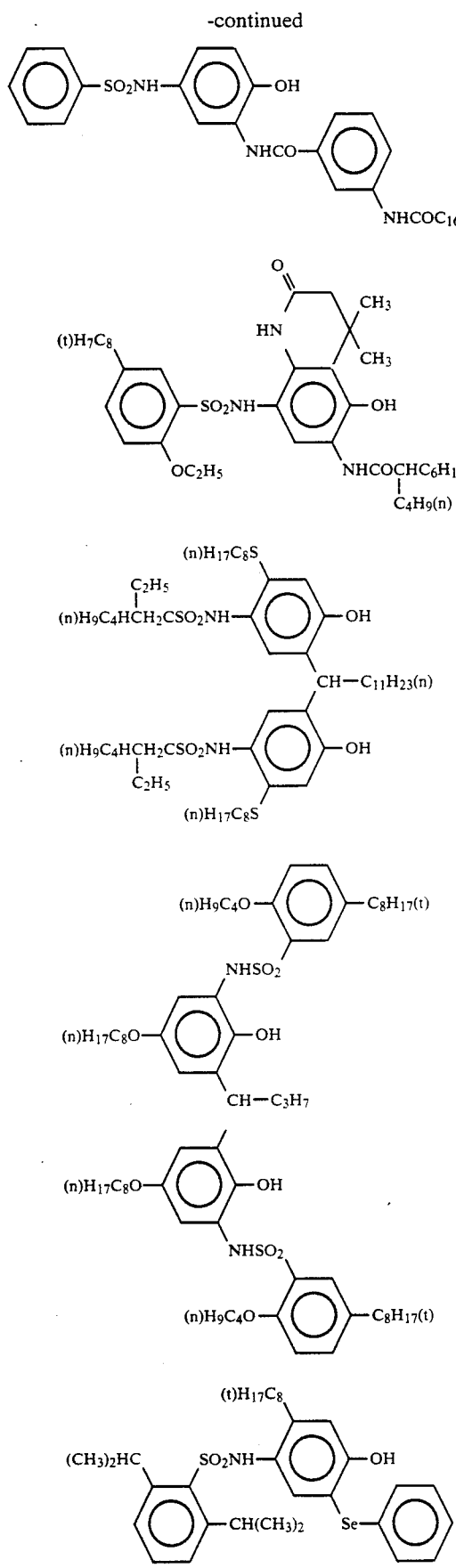

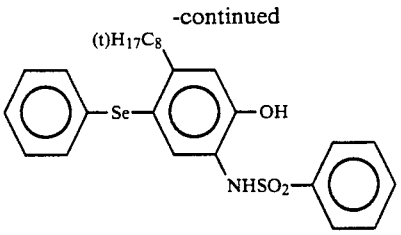

The reducing agent used in the present invention can be easily synthesized according to the following synthesis examples.

SYNTHESIS EXAMPLE 1

Synthesis of the Compound (4)

In 130 ml of acetonitrile were dispersed 16.5 g of 2-amino-4-n-hexadecyloxy-5-t-octylphenol p-toluenesulfonate (the synthesis method is described in Japanese Patent Provisional Publication No. 59(1984)-60434) and 6.50 ml of pyridine. To the mixture was dropwise added 4.90 g of benzenesulfonyl chloride for 10 minutes while stirring at room temperature. The mixture was further stirred for 2 hours at room temperature. The reaction mixture was poured into water, and then extracted with ethyl acetate. The obtained organic phase was washed with a saline solution, and dried over sodium sulfate. After removing the drying agent, the solvent was evaporated to obtain yellow crystals. The crude crystals were recrystallized out of a solvent (a mixture of acetonitrile and water) to obtain a colorless crystals of the compound (4). The yield was 13.2 g, m.p. 75°–76° C.

SYNTHESIS EXAMPLE 2

Synthesis of the Compound (5)

In 600 ml of acetonitrile were dispersed 66.3 g of 2-amino-4-t-butyl-5-n-hexadecyloxyphenol chloride and 38 ml of pyridine. To the mixture was dropwise added 32.5 g of p-methoxybenzenesulfonyl chloride for 20 minutes while stirring at room temperature. The mixture was further stirred for 2 hours at room temperature, and furthermore stirred for 1 hour at 50° C. The reaction vessel was then cooled in ice-cold water. Dilute hydrochloric acid was poured into the reaction mixture to precipitate crystals. The crystals were filtered out, washed with water and dried. The crude crystals were recrystallized out of n-hexane to obtain a colorless crystals of the compound (5). The yield was 76.4 g, m.p. 70°–73° C.

SYNTHESIS EXAMPLE 3

Synthesis of 4-t-butyl-6-(2,4,6-trichlorobenzenesulfonylimino)-2,4-cyclohexadienone In 500 ml of ethyl acetate were dispersed 60.0 g of 4-t-butyl-2-(2,4,6-trichlorobenzenesulfonylamino)-phenol and 63.8 g of manganese dioxide. The mixture was refluxed upon heating for 1 hour. After cooling the mixture, inorganic substances were filtered out with Celite. The solvent was then evaporated to obtain orange crystals. The crystals were used in the next reaction without further purification.

SYNTHESIS OF THE COMPOUND (13)

In 500 ml of methanol was dissolved 42.9 g of n-octanethiol. To the solution was stepwise added the above-synthesized orange crystals while stirring at room temperature. The mixture was further stirred for 3 hours at room temperature, and furthermore stirred for 1 hour at 50° C. The solvent was then evaporated to obtain a yellow oil. The obtained product was purified using silica gel column chromatography to obtain pale yellow powder of the compound (13). The yield was 35.7 g.

SYNTHESIS EXAMPLE 14

SYNTHESIS OF THE COMPOUND (18)

In 800 ml of dimethylformamide were dissolved 42.6 g of 2,4-diaminophenol dichloride and 172 g of p-dodecyloxybenzenesulfonyl chloride. To the mixture was stepwise added 87.1 g of sodium hydrogencarbonate while stirring at room temperature. The mixture was further stirred for 2 hours at room temperature, and furthermore stirred for 3 hours at 50° C. The reaction mixture was poured into water, and then extracted with ethyl acetate. The obtained organic phase was washed with water and a saline solution, and dried over sodium sulfate. The drying agent was filtered out, and the solvent was evaporated to obtain yellow crystals. The crude crystals were recrystallized out of acetonitrile to obtain pale yellow crystals of the compound (18). The yield was 139 g, m.p. 139°–140° C.

In the present invention, the above-mentioned compounds are used as the reducing agents. The compound having the formula [I] has (1) a function as a developing agent for silver halide; (2) substantially no function as a polymerization inhibitor for the ethylenically unsaturated polymerizable compound; and (3) a property of forming an oxidation product which has a function as a polymerization inhibitor after development of silver halide. The reducing agents (the compounds having the formula [I]) may be used singly or in combination.

The amount of the reducing agent preferably is in the range of 0.11 to 1,500 mole % based on 1 mole of silver (contained in the silver halide and the organic silver salt), and more preferably is in the range of 10 to 500 mole %.

In the image recording process of the present invention, the reducing agent having the formula [I] can be used in combination with the reducing agent disclosed in Japanese Patent Provisional Publication No. 61(1986)-243449. Further, the reducing agent can be used in combination with another reducing agent which is known as a developing agent in the silver halide photography. Examples of the known developing agent include hydroquinones, catechols, p-aminophenols, p-phenylenediamines, 3-pyrazolidones, 3-aminopyrazoles, 4-amino-5-pyrazolones, 5-aminouracils, 4,5-dihydroxy-6-aminopyrimidines, reductones, aminoreductones, o- or p-sulfonamidophenols, o- or p-sulfonamidonaphthols, 2-sulfonamidoindanones, 4-sulfonamido-5-pyrazolones, 3-sulfonamidoindoles, sulfonamidopyrazolo benzimidazoles, sulfonamidopyrazolotriazoles and α-sulfonamidoketones.

Concrete examples of the developing agents include pentadecylhydroquinone, 5-t-butylcatechol, p-(N,N-diethylamino)phenol, 1-phenyl-4-methyl-4-hydroxymethyl-3-pyra-zolidone, 1-phenyl-4-methyl-4-heptadecylcarbonyloxymethyl-3-pyrazolidone, 2-phenylsulfonylamino-4-hexadecyloxy-5-t-octylphenol, 2-phenylsulfonylamino-4-t-butyl-5-hexadecyloxyphenol, 2-(N-butylcarbamoyl)-4-phenylsulfonylaminonaphthol and 2-(N-methyl-N-octadecylcarbamoyl)-4-sulfonylaminonaphthol.

The other reducing agents (including developing agents) which can be used in combination with the reducing agent of the present invention are described in T. James, "The Theory of the Photographic Process", 4th edition, pp. 291-334 (1977), Research Disclosure Vol. 170, No. 17029, pp. 9-15 (June 1978), and Research Disclosure Vol. 176, No. 17643, pp. 22-31 (December 1978).

In the case that the two or more reducing agents are used in combination, certain interactions between the reducing agents can be expected. One of the interactions is for acceleration of reduction of silver halide (and/or an organic silver salt) through so-called superadditivity. Other interaction is for a chain reaction in which an oxidation product of one reducing agent formed by a reduction of silver halide (and/or an organic silver salt) inhibits the polymerization of the polymerizable compound via an oxidation-reduction reaction with the other reducing agent. Both interactions may occur simultaneously, so that it is difficult to determine which of the interactions has occurred in practical use.

The steps (I), (II) and (III) of the image recording process of the present invention, namely, (I) imagewise exposing silver halide to light to form a latent image of the silver halide (the latent image is formed in the silver halide); (II) developing the formed latent image of the silver halide (i.e., the silver halide having the latent image) with a reducing agent; and (III) conducting substantially uniform light exposure in the presence of a photopolymerization initiator and an ethylenically unsaturated polymerizable compound to form a polymer image are hereinafter described in detail.

(I) At the step of the imagewise light exposure, various exposure means can be employed. Examples of the light source include a tungsten lamp, a halogen lamp, a mercury lamp, a fluorescent lamp, a xenon lamp, a laser beam, LED, and CRT. The latent image of the silver halide is obtained by the imagewise exposure of radiation including visible light. The kind of light source or the amount of light employed in the exposure can be selected depending on the light-sensitive wavelength determined by the spectral sensitization or the sensitivity of silver halide. The original image can be either monochromatic image or color image. The amount of the light at the imagewise exposure is generally in the range of $10^{-2}$ to $10^4$ cms (Cd (candela).m.sec).

In an embodiment wherein both of the photopolymerization initiator and the polymerizable compound are contained in an image recording material, the polymerizable compound may be polymerized by the photopolymerization initiator within the exposed area at the step of the imagewise exposure. But, the influence of the photopolymerization initiator at the step of the imagewise exposure is substantially negligible, since the sensitivity of the photopolymerization initiator is much lower than the sensitivity of silver halide.

(II) Development of the latent image of silver halide can be conducted using a developing solution. However, the heat development has an advantage of simple procedures and short processing time, compared with the wet development using the developing solution. Therefore, the heat development is particularly preferred.

The heat development can be conducted in various known manners. Examples of the heating means include a hot plate, heated rollers and an infrared heater. The heating layer which is arranged on the image recording material can be used as the heating means. At the heat development, the image recording material can be heated under such a condition that the amount of oxygen contained in the image recording material is restrained. In order to restrain the amount of the oxygen, a liquid (preferably water) is preferably contained in the image recording layer of the image receiving material. Heating temperature for the development process usually ranges from 80° C. to 200° C., and preferably from 100° C. to 160° C. The heating time is usually from 1 second to 5 minutes, and preferably from 5 seconds to 1 minutes.

(III) Examples of the light source at the uniform light exposure are the same as the above-mentioned light source at the imagewise light exposure. The amount of the light at the uniform exposure is generally in the range of $10^3$ to $10^8$ erg/cm$^2$, and preferably in the range of $10^4$ to $10^6$ erg/cm$^2$.

The image recording process of the present invention can be classified into the following two embodiments based on the form of the image recording material.

In the first embodiment, the silver halide and the photopolymerization initiator are contained in one image recording material. The silver halide and the photopolymerization initiator are preferably contained in one image recording layer of the image recording material. Further, the reducing agent and the polymerizable compound in addition to the silver halide and the photopolymerization initiator are preferably contained in the image recording material.

The first embodiment of the image recording process of the present invention preferably comprises the steps of: (I) imagewise exposing to light an image recording material which comprises a support and an image recording layer containing silver halide, a reducing agent, a photopolymerization initiator and an ethylenically unsaturated polymerizable compound to form a latent image of the silver halide; (II) heating the image recording material to develop the formed latent image of the silver halide with a reducing agent; and (III) substantially uniformly exposing to light the image recording material to form a polymer image.

In the second embodiment, a layer containing the silver halide and a layer containing the photopolymerization initiator are provided on different supports, respectively. The layer containing the silver halide provided on a support is hereinafter referred to as "silver halide element", and the layer containing the photopolymerization initiator provided on another support is referred to as "photopolymerization initiator element".

The second embodiment of the image recording process of the present invention comprises the steps of: (I) imagewise exposing to light the silver halide element to form a latent image of the silver halide; (II) developing the formed latent image of the silver halide by heating the silver halide element or developing the element with water (in the case that a reducing agent is contained in the silver halide element) or by developing the silver halide element with a solution of a reducing agent (in the case that the reducing agent is not contained in the silver halide element); (III-a) pressing the developed silver halide element on the photopolymerization initiator element (optionally while heating) to transfer the remaining reducing agent from the silver halide element to the photopolymerization initiator element; and (III-b) substantially uniformly exposing to light the photopolymerization initiator element in the presence of an ethylenically unsaturated polymerizable compound to form a polymer image. At the step of (III-b), the silver halide element may be either in contact with the photopolymerization initiator element or separated from the photopolymerization initiator element.

In the image recording process of the present invention, the first embodiment is preferred to the second embodiment.

As is mentioned above, a polymer image is formed according to the present invention. The unpolymerized polymerizable compound can be removed by washing the recording material with a solvent of the polymerizable compound. A color image can be obtained by fixing a dye or pigment on the polymer image. A color image can also be formed by bleaching (decoloring) a dye with an unpolymerized ethylenically unsaturated polymerizable compound.

Further, an image can be formed on an image receiving material, according to the present invention.

The image recording material wherein a polymer image has been formed is pressed on an image receiving material to transfer the image to the image receiving material. For applying a pressure on the image recording material, various known methods can be employed.

In the case that the image recording material contains a color image forming substance, the color image forming substance is fixed within the area where a polymer image has been formed. Then, the image recording material is pressed on an image receiving material to transfer the color image forming substance within the unfixed area to the image receiving material. Thus, a color image can be formed on the image receiving material.

After an image is formed on the image receiving material, the image receiving material can be heated or irradiated with light to polymerize the transferred unpolymerized polymerizable compound. The image obtained by the abovementioned process is improved in the preservability.

The image recording process of the invention can be used for monochromatic or color photography, printing, radiography, medical diagnosis (e.g., CRT photography of diagnostic device using ultrasonic wave), copy (e.g., computer-graphic hard copy), etc.

The first embodiment of the image recording process of the present invention is hereinafter described in more detail referring to FIGS. 1 to 5.

FIG. 1 is a sectional view schematically illustrating an embodiment of an image recording material used in the present invention.

As is shown in FIG. 1, the image recording material comprises a support (11) and an image recording layer (12). The image recording layer contains silver halide (□), a reducing agent (△) which forms an oxidation product having a function as a polymerization inhibitor, a photopolymerization initiator (○) and an ethylenically unsaturated polymerizable compound.

FIG. 2 is a sectional view schematically illustrating the step of imagewise exposing to light the image recording material.

FIG. 2-a is a diagram showing the reaction at the step of imagewise exposing to light the image recording material.

As is shown in FIG. 2 and FIG. 2-a, the latent image of silver halide (□) is formed within the exposed area (22). The silver halide (□) remains within the unexposed area (21).

FIG. 3 is a sectional view schematically illustrating the step of heating the image recording material.

FIG. 3-a is a diagram showing the reaction at the step of heating the image recording material.

As is shown in FIG. 3 and FIG. 3-a, the silver halide is developed (▨), and an oxidation product of the reducing agent (▲) is formed within the area (32) where the latent image of silver halide (□) has been formed. The oxidation product of the reducing agent (▲) has a function as a polymerization inhibitor. The reducing agent (△) remains within the area (31) where the latent image of silver halide has not been formed.

FIG. 4 is a sectional view schematically illustrating the step of uniformly exposing to light the image recording material.

As is shown in FIG. 4, the polymerizable compound is polymerized with the photopolymerization initiator (○) within the area (41) where the reducing agent (△) remains. On the other hand, the polymerizable compound is not polymerized within the area (42) where the oxidation product of the reducing agent (▲) having a function as a polymerization inhibitor has been formed.

FIG. 5 is a sectional view schematically illustrating the step of pressing the image recording material on an image receiving material.

As is shown in FIG. 5, the unpolymerized area (52) is transferred to the image receiving material (53). On the other hand, the polymerized area (52) remains on the image recording material.

As is described above, a polymer image is formed within the unexposed area at the imagewise exposure according to the image recording process of the present invention. It is further apparent that the exposed area is transferred from the image recording material to the image receiving material. The process of the present invention wherein the polymer image is formed within the unexposed area has an advantage over the process disclosed in Japanese Patent Provisional Publication No. 61(1986)-243449 wherein the polymer image is formed within the exposed area.

The image recording material used in the image recording process of the present invention is described below. The image recording material preferably comprises a support and an image recording layer containing silver halide, a reducing agent, a photopolymerization initiator and an ethylenically unsaturated polymerizable compound, as is mentioned above. Therefore, this embodiment of the image recording material is hereinafter particularly described.

Examples of the silver halide employable in the image recording material include silver chloride, silver bromide, silver iodide, silver chlorobromide, silver chloroiodide, silver iodobromide and silver chloroiodobromide in the form of grains.

The halogen composition of individual grains may be homogeneous or heterogeneous. The heterogeneous grains having a multi-layer structure in which the halogen composition varies from the outer surface portion (i.e., shell) to the inside portion (i.e., core) are described in Japanese Patent Provisional Publication Nos. 57(1982)-154232, (1983)-108533, 59(1984)-48755 and 59(1984)-52237, U.S. Pat. No. 4,433,048, and European Patent No. 100,984. A silver halide grain having a core/shell structure in which the silver iodide content in the shell is higher than that in the core can be also employed.

There is no specific limitation on the crystal habit of silver halide grains. For example, a tabular grain having an aspect ratio of not less than 3 can be used.

It is preferred to use silver halide grains having a relatively low fogging value.

Two or more kinds of silver halide grains which differ in halogen composition, crystal habit, grain size, and/or other features from each other can be employed in combination.

There is no specific limitation on the grain size distribution of silver halide grains. For example, silver halide grains having an almost uniform grain size distribution can be employed, as is described in Japanese Patent Provisional Publication No. 62(1987)-210448.

The silver halide grains preferably have a mean grain (or particle) size of 0.001 to 5 $\mu$m, more preferably 0.001 to 2 $\mu$m.

The amount of the silver halide grains contained in the image recording layer preferably is in the range of 0.1 mg/m$^2$ to 10 g/m$^2$ in terms of silver contained the silver halide and an organic silver salt, which is one of optional components. The amount of the silver halide contained in the image recording layer preferably is not more than 1 g/m$^2$, more preferably in the range of 1 to 500 mg/m$^2$, in terms of silver only contained in the silver halide.

The reducing agent contained in the image recording material is described above.

Examples of the photopolymerization initiator used in the present invention include carbonyl compounds such as ketones (e.g., acetophenone, benzoins, benzyl, diacetyl and benzophenone) and quinones (e.g., anthraquinones, naphthoquinones and phenanthrenequinones), organic sulfur compounds, peroxides, halogen compounds, photo-semiconductors (e.g., zinc oxide and titanium dioxide) polycyclic quinones, benzophenones, substituted benzophenones, xanthones, thioxanthones, benzoins), metal ions (e.g., iron (I) ion, metal carbonyls, metal complexes and uranyl salts), azo and diazo compounds and photo-reducible dyes.

The photopolymerization initiator which can be used in the present invention is described in Oster et al. *Chemical Review*, Vol. 68, pp. 125–151 (1968), Kosar, *Light-Sensitive Systems*, John Wiley & Sons, 1965, pp. 158–193, and *Fine Chemical*, Vol. 16, No. 9, pp. 5–19 (particularly at Table 2) (1987).

The photopolymerization initiator using the photo-reducible dye generally comprises a hydrogen donor and the photo-reducible dye. A radical initiating a polymerization can be formed by a reaction between the light-excited dye and the hydrogen donor. Examples of the photo-reducible dye include Methylene Blue, Thionine, Rose Bengal, Erythrosine B, Eosine, Rhodamine, Phloxine B, Safranine, acryflavine, riboflavin, fluoresceine, uranine, benzoflavin, N,N,N',N'-tetra-n-butylthionine, N,N,N',N'-tetramethyl-4'-dodecylsafranine, Acridine Orange, Acridine Yellow, 9,10-phenanthrenequinone, benzanthrone and the other carbonyl compounds. Examples of the hydrogen donor include $\beta$-diketones (e.g., dimedone and acetylacetone), amines (e.g., triethanolamine, diethanolamine, monoethanolamine, dimethylamine, diethylamine, tetramethylethylenediamine, triethylamine and phenylhydrazine), sulfinic acids and the salt thereof (e.g., p-toluenesulfinic acid, benzenesulfinic acid and p-(N-acetylamino)benzenesulfinic acid), N-phenylglycine, L-ascorbic acid, thiourea and arylthioureas.

The molar ratio of the photo reducible dye to the hydrogen donor is preferably in the range of 0.005 to 3, and more preferably in the range of 0.05 to 1. In the case that a carbonyl compound such as 9,10-phenanthrenequinone is used as the photo-reducible dye, there is no need of using a hydrogen donor because a binder can function as the hydrogen donor.

In the image recording process of the present invention, the photopolymerization initiator is preferably used in an amount of 0.0001 mole to 0.1 mole based on 1 mole of the ethylenically unsaturated polymerizable compound, and more preferably used in an amount of 0.001 mole to 0.05 mole.

There is no specific limitation with respect to the polymerizable compound, except that the compound has an ethylenically unsaturated bond. Any known ethylenic unsaturated polymerizable compounds can be employed in the invention. In the case that a heat development is employed, the polymerizable compound preferably has a relatively higher boiling point (e.g., 80° C. or higher) to be hardly evaporated at the heat development. In the case that the image recording layer contains a color image forming substance, the polymerizable compounds are preferably cross-linkable compounds having plural polymerizable groups in the molecule, because such cross-linkable compounds favorably serve for fixing the color image forming substance in the course of polymerization hardening of the polymerizable compounds. Further, in the case that a transferred image is formed on an image receiving material, the polymerizable compound preferably has a high viscosity of not lower than 100 cP at 25° C.

Examples of the ethylenically unsaturated polymerizable compound include acrylic acid, salts of acrylic acid, acrylic esters, acrylamides, methacrylic acid, salts of methacrylic acid, methacrylic esters, methacrylamide, maleic anhydride maleic acid esters, itaconic acid esters, styrene, styrene derivatives, vinyl ethers, vinyl esters, N-vinyl heterocyclic compounds, allyl ethers allyl esters, and derivatives thereof.

Concrete examples of the acrylic esters include n-butyl acrylate, cyclohexyl acrylate, 2-ethylhexyl acrylate, benzyl acrylate, furfuryl acrylate, ethoxyethoxyethyl acrylate, dicyclohexyloxyethyl acrylate, nonylphenyloxyethyl acrylate, hexanediol diacrylate, butanediol diacrylate, neopentylglycol diacrylate, trimethylolpropane triacrylate, pentaerythritol tetraacrylate, dipentaerythritol pentaacrylate, dipentaerythritol hexacrylate, diacrylate of polyoxyethylenated bisphenol A, diacrylate of 2,2-dimethyl-3-hydroxypropane aldehyde and trimethylolpropane condensate, triacrylate of 2,2-dimethyl-3-hydroxypropion aldehyde and pentaerythritol condensate, polyacrylate of hydroxypolyether, polyester acrylate and polyurethane acrylate.

Concrete examples of the methacrylic esters include methyl methacrylate, butyl methacrylate, ethylene glycol dimethacrylate, butanediol dimethacrylate, neopentylglycol dimethacrylate, trimethylolpropane trimethacrylate, pentaerythritol trimethacrylate, pentaerythritol tetramethacrylate, and dimethacrylate of polyoxyalkylenated bisphenol A.

The polymerizable compounds can be used singly or in combination of two or more compounds. For example, a mixture of two or more polymerizable compounds can be employed. Further, a compound formed by bonding a polymerizable group such as a vinyl group or a vinylidene group to a reducing agent is also employed as the polymerizable compound. The image recording material using the compound which shows a function as both the reducing agent and the polymerizable compound or as both the color image forming substance and the polymerizable compound is included in the embodiment of the image recording material used in the invention.

The amount of the polymerizable compound to be contained in the image recording material preferably ranges from 5 to 120,000 parts by weight, and more preferably from 12 to 12,000 parts by weight, per one part by weight of the silver halide.

The image recording material can be prepared by arranging an image recording layer containing the above-mentioned components on a support. There is no specific limitation with respect to the support. In the case that a heat development is employed, a material for the support preferably is resistant to heat given at the heat development. Examples of the material employable for the preparation of the support include glass, paper, fine paper, coat paper, cast-coat paper, synthetic paper, metals and analogues thereof, films of polyester, acetyl cellulose, cellulose ester, polyvinyl acetal, polystyrene, polycarbonate and polyethylene terephthalate, and paper laminated with resin or polymer (e.g., polyethylene).

In the case that a porous material such as paper is employed as the support, the porous support preferably has such a surface characteristic that a filtered maximum waviness of not less than 4 μm is observed in not more than 20 positions among 100 positions which are determined at random on a filtered waviness curve obtained according to JIS-B-0610. A surface of the paper support preferably has a low water absorptiveness of not more than 3 g/m$^2$ which is a value measured according to Cobb test method. The paper support preferably has such a smooth surface that the smoothness value in terms of the Bekk Smoothness is not less than 300 seconds. The paper support preferably has a low shrinkage ratio of not more than 0.15% both in the machine direction and in the cross direction, wherein the shrinkage ratio is a value measured at the change of relative humidity from 75% to 60%. Further, the paper support preferably has a low air permeability of not less than 300 seconds, wherein the air permeability is a time required for 100 ml of air to pass through the paper support of an area of 645 mm$^2$ at pressure of 567 g. Furthermore, the paper support preferably has a pH value in the range of 5 to 9.

Various embodiments of the image recording material, optional components which may be contained in the image recording layer, and auxiliary layers which may be optionally arranged on the image recording material are described below.

In the image recording material, the polymerizable compound is preferably dispersed in the image recording layer in the form of oily droplets. In the oily droplets may be contained other components of the image recording layer such as silver halide grain, the reducing agent, the photopolymerization initiator and a color image forming substance. In the case that silver halide is to be contained in the oily droplets, the number of the silver halide grains to be contained in one oily droplet preferably is 5 or more.

The oily droplet of the polymerizable compound is more preferably in the form of microcapsule. There is no specific limitation on the process for the formation of the microcapsule, and any known process can be applied to the invention.

There is no specific limitation on the shell materials of the microcapsules, and various known materials such as polymers can be employed as the shell materials. Examples of the shell material include polyamide resin and/or polyester resin, polyurea resin and/or polyurethane resin, amino-aldehyde resin, gelatin, epoxy resin, a complex resin of polyamide and polyurea, a complex resin of polyurethane resin and polyester resin.

In the case that the shell material is composed of a condensed aldehyde resin, the amount of the residual aldehyde preferably is not more than 5 mole based on 1 mole of the reducing agent.

It is preferred that at least 70 weight % (more preferably at least 90 weight %) of the silver halide is arranged in the shell of the microcapsules.

There can be employed two or more kinds of microcapsules in combination which are different from each other in at least one component among the components capable of being contained in microcapsules such as a silver halide, a reducing agent, a polymerizable compound and a color image forming substance. Especially in the case of forming a full-color image, three or more kinds of microcapsules having different color phases are preferably employed in combination.

The mean particle size of the microcapsules preferably is in the range of 3 to 20 $\mu$m. The amount of the microcapsules having a small particle size of not larger than one sixth part of the average particle size preferably is not more than 1 volume % of the total amount of the microcapsules. Further, the amount of the microcapsules having a large particle size of not smaller than twice as large as the average particle size preferably is not more than 1 volume % of the total amount of the microcapsules. Furthermore, the proportion of the average thickness of the shell of the microcapsules to the average particle size preferably ranges from $0.5 \times 10^{-2}$ to $5 \times 10^{-2}$.

In the case that the silver halide grains are contained in microcapsules, the mean grain size of the silver halide preferably is not more than one fifth parts of the mean size of the microcapsules, more preferably not more than one tenth parts of the mean size of the microcapsules. When the mean size of the microcapsules is not more than one fifth parts of the mean grain size of silver halide, even and uniform image can be obtained.

The image recording layer can further contain optional components such as color image forming substances, sensitizing dyes, organic silver salts, radical generators, various kinds of image formation accelerators, thermal polymerization inhibitors, development stopping agents, fluorescent brightening agents, discoloration inhibitors, antihalation dyes or pigments, antiirradiation dyes or pigments, dyes decolored by irradiation with light, matting agents, antismudging agents, plasticizers, water releasers, binders, solvents of the polymerizable compound and water soluble vinyl polymers.

In the image recording material, a polymer image can be obtained on the image recording layer having the above-mentioned constitution. Further, a color image can be obtained on the image recording layer by incorporating a color image forming substance as an optional component into the image recording layer.

There is no specific limitation with respect to the color image forming substance, and various kinds of substances can be employed. Examples of the color image forming substance include colored substance (i.e., dyes and pigments) and non-colored or almost non-colored substance (i.e., color former or dye or pigment-precursor) which develops to give a color under application of external energy (e.g., heating, pressing, light irradiation, etc.) or by contact with other components (i.e., developer).

Examples of the dyes and pigments (i.e., colored substance) employable in the invention include commercially available ones as well as various known compounds described in the technical publications, for example, Yuki Gosei Kagaku Kyokai (ed.), Handbook of Dyes (in Japanese, 1970) and Nippon Ganryo Gijutsu Kyokai (e.,), new handbook of pigments (in Japanese, 1977). Those dyes and pigments can be used in the form of a solution or dispersion.

Examples of the substances which develop to give a color by certain energy include thermochromic compounds piezochromic compounds, photochromic compounds and leuco compounds derived from triarylmethane dyes, quinone dyes, indigoid dyes, azine dyes, etc. Those compounds can develop to give a color by heating, application of pressure, light-irradiation or air oxidation.

Examples of the substances which develop to give a color in contact with other components include various compounds capable of developing a color through some reaction between two or more components, such as acid-base reaction, oxidation-reduction reaction, coupling reaction, chelating reaction, and the like. Examples of color formation systems are described in Hiroyuki Moriga, "Introduction of Chemistry of Speciality Paper" (in Japanese, 1975), pp. 29-58 (pressure-sensitive copying paper, [pp. 87-95 (azo-graphy), pp. 118-120 (heat-sensitive color formation by a chemical change) or in MSS. of the seminar promoted by the Society of Kinki Chemical Industry, "The Newest Chemistry of Coloring Matter-Attractive Application and New Development as a Functional Coloring Matter", pp. 26-32 (Jun. 19, 1980). Examples of the color formation systems specifically include a color formation system used in pressure-sensitive papers, comprising a color former having a partial structure of lactone, lactam, spiropyran, and an acidic substance (developer), e.g., acid clay, phenol, etc.; a system utilizing azo-coupling reaction between an aromatic diazonium salt, diazotate or diazosulfonate and naphthol, aniline, active methylene; a system utilizing a chelating reaction, such as a reaction between hexamethylenetetramine and a ferric ion and gallic acid, or a reaction between a phenolphthalein-complexon and an alkaline earth metal ion; a system utilizing oxidation-reduction reaction, such as a reaction between ferric stearate and pyrogallol, or a reaction between silver behenate and 4-methoxy-1-naphthol.

The color image forming substance is preferably used in an amount of 0.5 to 20 parts by weight, and more preferably 2 to 7 parts by weight, per 100 parts by weight of the polymerizable compound. In the case that the developer is employed, the amount of the developer is preferably in the range of approx. 0.3 to 80 parts by weight per one part by weight of the color former (i.e., leuco dye).

In the case of using two kinds of color image forming substances which give a color when they are brought into contact with each other (e.g., color former and a developer), one substance and the polymerizable compound are contained in the microcapsule, and the other is arranged outside of the microcapsule in the image recording layer, whereby a color image can be formed on the image recording layer.

There is no specific limitation with respect to the sensitizing dyes, and any known sensitizing dyes used in the conventional art of photography may be employed in the image recording material. Examples of the sensitizing dyes include methine dyes, cyanine dyes, merocyanine dyes, complex cyanine dyes, complex merocyanine dyes, holopolar cyanine dyes, hemicyanine dyes, styryl dyes, and hemioxonol dyes. These sensitizing dyes can be employed singly or in combination, but two or more sensitizing dyes are generally employed in combination for the purpose of supersensitization. In addition to the sensitizing dye, a substance which does not per se exhibit spectral sensitization effect or does not substantially absorb visible light but shows supersensitizing activity can be employed. The amount of the sensitizing dye to be added generally ranges from approx. $10^{-8}$ to $10^{-2}$ mole per 1 mole of the silver halide.

The sensitizing dye is preferably added during the stage of the preparation of the silver halide emulsion. The sensitizing dye having a sensitivity within the infrared region can be also employed in combination with another sensitizing dye.

Adding of an organic silver salt to the image recording material is particularly effective for the heat development. The reason is assumed that the organic silver salt takes part in a redox reaction using a silver halide latent image as a catalyst when heated to a temperature of 80° C. or higher. In such case, the organic silver salt is preferably located in contact with the silver halide or closely to the silver halide. Examples of organic compounds pounds employable for forming such organic silver salt include aliphatic or aromatic carboxylic acids, thiocarbonyl group-containing compounds having a mercapto group or an α-hydrogen atom, and imino group-containing compounds. Benztriazoles are most preferred. The organic silver salt is generally used in an amount of from 0.01 to 10 mole, preferably from 0.01 to 1 mole, per 1 mole of the silver halide. Instead of the organic silver salt, an organic compound (e.g., benzotriazole) which can form an organic silver salt in combination with an inorganic silver salt can be added to the image recording layer to obtain the same effect.

Examples of the radical generators include a triazene silver, a silver diazotate and an azo compound.

Various image formation accelerators are employable in the image recording material. The image formation accelerators have a function to accelerate the oxidation-reduction reaction between a silver halide (and/or an organic silver salt) and a reducing agent, a function to accelerate emigration of an image forming substance from an image recording layer to an image receiving material or an image receiving layer (described hereinafter), or a similar function. The image formation accelerators can be classified into inorganic bases, organic bases, base precursors, oils, surface active agents, compounds functioning as an antifogging agent and/or a development accelerator, hot-melt solvents, compounds functioning as antioxidants, and the like, from the viewpoint of physicochemical functions. These groups, however, generally have certain combined functions, that is, two or more of the above-mentioned effects, so that the above classification is for the sake of convenience, and one compound often has a plurality of functions combined.

Examples of the image formation accelerators are given below.

Preferred examples of the inorganic bases include hydroxides of alkali metals or alkaline earth metals; secondary or tertiary phosphates, borates, carbonates, quinolinates and metaborates of alkali metals or alkaline earth metals; a combination of zinc hydroxide or zinc oxide and a chelating agent; ammonium hydroxide; hydroxides of quaternary alkylammoniums; and hydroxides of other metals. Preferred examples of the organic bases include aliphatic amines (e.g., trialkylamines, hydroxylamines and aliphatic polyamines); aromatic amines (e.g., N-alkyl-substituted aromatic amines, N-hydroxylalkyl-substituted aromatic amines and bis [p-(dialkylamino)-phenyl]-methanes), heterocyclic amines, amidines, cyclic amidines, guanidines, and cyclic guanidines. Of these bases, those having a pKa of 7 or more are preferred.

The base precursors preferably are those capable of releasing bases upon reaction by heating, such as salts between bases and organic acids capable of decarboxylation by heating, compounds capable of releasing amines through intramolecular nucleophilic substitution, Lossen rearrangement, or Beckmann rearrangement, and the like; and those capable of releasing bases by electrolysis. Examples of the base precursors include guanidine trichloroacetate, piperidine trichloroacetate, morpholine trichloroacetate, p-toluidine trichloroacetate, 2-picoline trichloroacetate, guanidine phenylsulfonylacetate, guanidine 4-chlorophenylsulfonylacetate, guanidine 4-methylsulfonylphenylsulfonylacetate, and guanidine 4-acetylaminomethylpropionate.

The bases or the base precursors can be employed in the amount of wide range in the image recording material. The base or base precursor is preferably employed in an amount of not more than 100% by weight, more preferably from 0.1 to 40% by weight, based on the total solid content of the image recording layer. These bases or base precursors can be used singly or in combination.

In the case of using the base or the base precursor in the image recording material, it is preferred that the silver halide, the reducing agent, the photopolymerization initiator and the polymerizable compound are contained in the aforementioned microcapsules, and the base or base precursor is arranged outside of the microcapsule in the image recording layer. Otherwise, the base or base precursor can be contained in different microcapsules from those containing the polymerizable compound. The base or base precursor can be contained in the microcapsules under the condition that the base or base precursor is dissolved or dispersed in an aqueous solution of a water retention agent, or under condition that the base or base precursor is adsorbed on solid particles. The base or base precursor contained in the microcapsules preferably has a melting point in the range of 70° to 210° C. Further, the base or base precursor can be dissolved in solid grains in combination with hydrophobic substance.

The base or base precursor can be contained in a layer different from the image recording layer. Further, the base or base precursor may be contained in the porous support.

Examples of the oils employable in the invention include high-boiling organic solvents which are used as solvents for emulsifying and dispersing hydrophobic compounds.

Examples of the surface active agents employable in the invention include pyridinium salts, ammonium salts and phosphonium salts as described in Japanese Patent Provisional Publication No. 59(1984)-74547; polyalkylene oxides as described in Japanese Patent Provisional Publication No. 59(1984)-57231.

The compounds functioning as an antifogging agent and/or a development accelerator can be used to give an image of high sharpness having a high maximum density and a low minimum density (i.e., an image having high contrast).

Examples of the compounds functioning as an antifogging agent and/or a development accelerator include a conventional antifogging agent (e.g., a 5- or 6-membered nitrogen containing heterocyclic compound), a compound having a cyclic amido structure, a thioether compound, a polyethylene glycol derivative, a thiol derivative, an acetylene compound, a sulfonamide derivative and a salt of quaternary ammonium ion.

The hot-melt solvents preferably are compounds which may be used as a solvent of the reducing agent or those which have high dielectric constant and can accelerate physical development of silver salts. Examples of the hot-melt solvents include polyethylene glycols, derivatives of polyethylene oxides (e.g., oleate ester), bees wax, monostearin and high dielectric constant compounds having $-SO_2-$ and/or $-CO-$ group described in U.S. Pat. No. 3,347,675; polar compounds described in U.S. Pat. No. 3,667,959; and 1,10-decanediol, methyl anisate and biphenyl suberate described in Research Disclosure, pp. 26-28 (December 1976). The hot-melt solvent is preferably used in an amount of from 0.5 to 50% by weight, and more preferably from 1 to 20% by weight, based on the total solid content of the image recording layer.

The compounds functioning as an antioxidant can be employed for the purpose of eliminating the oxygen influence (oxygen has a function as a polymerization inhibitor). An example of the compounds functioning as an antioxidant is a compound having two or more mercapto groups.

The development stopping agents employable in the image recording material are compounds that neutralize a base or react with a base to reduce the base concentration in the layer to hereby stop development, or compounds that mutually react with silver or a silver salt to suppress development. More specifically, examples of the development stopping agents include acid precursors capable of releasing acids upon heating electrophilic compounds capable of undergoing substitution reaction with a coexisting base upon heating, nitrogen-containing heterocyclic compounds, mercapto compounds, and the like. Examples of the acid precursors include oxide esters described in Japanese Patent Provisional Publication Nos. 60(1985)-108837 and 60(1985)-192939 and compounds which release acids through Lossen rearrangement described in Japanese Patent Provisional Publication No. 60(1985)-230133. Examples of the electrophilic compounds which induce substitution reaction with bases upon heating are described in Japanese Patent Provisional Publication No. 60(1985)-230134.

For the purpose of anti-halation or anti-irradiation, dyes or pigments can be added to the image recording layer of the image recording material. For example, white pigments can be contained in the image recording layer.

In the case that the image recording layer of the image recording material employes microcapsules, the dyes having properties of being decolorized when it is heated or irradiated with light can be used. The dyes having such properties can be used in the image recording material as a yellow filter layer in a conventional silver salt photographic system.

The antismudging agents employable in the image recording material preferably are particles which are solid at ambient temperatures. Examples of the antismudging agents include starch particles described in U.K. Patent No 1,232,347; polymer particles described in U.S. Pat. No. 3,625,736; microcapsule particles containing no color former described in U.K. Patent No. 1,235,991; and cellulose particles, and inorganic particles, such as particles of talc, kaolin, bentonite, agalmatolite, zinc oxide, titanium dioxide or aluminum oxide described in U.S. Pat. No. 2,711,375. Such particles preferably have a mean size of 3 to 50 $\mu$m, more preferably 5 to 40 $\mu$m. The size of the particle is preferably larger than that of the microcapsule. In the case that the oily droplets of the polymerizable compound is in the form of microcapsules, the size of the particle is preferably larger than that of the microcapsule.

The binder employable in the image recording material can be contained in the image recording layer singly or in combination. The binder preferably is a hydrophilic binder, and representative hydrophilic binders are transparent or semi-transparent binders. Examples of the binders include natural substances such as gelatin, gelatin derivatives, cellulose derivatives, starch and gum arabic, and synthetic polymeric substances such as water-soluble polyvinyl compounds (e.g., polyvinyl alcohol, polyvinylpyrrolidone and acrylamide polymers). Other synthetic polymeric substances such as vinyl compounds dispersed in the form of latex, which are particularly effective to increase dimensional stability of photographic materials, can be also employed. The binder is preferably employed in an amount of 2 to 100 wt. % based on the amount of the polymerizable compound.

In the case of using a solvent for the polymerizable compound, the solvent is preferably contained in a microcapsule which is different from the microcapsule containing the polymerizable compound.

A water soluble vinyl polymer is preferably adsorbed on the silver halide grains.

Examples and usage of other components than the above-mentioned ones which can be optionally contained in the image recording layer are also described in the above-mentioned publications concerning the image recording material, and in Research Disclosure Vol. 170, No. 17029, pp. 9-15 (June 1978).

The image recording layer of the image recording material comprising the above-mentioned components preferably has a pH value of not more than 7.

Examples of auxiliary layers which are optionally arranged on the image recording material include an image receiving layer, a heating layer, an antistatic layer, an anti-curling layer, a peel layer, a cover sheet, a protective layer, a layer containing a base or a base precursor, a base barrier layer and an anti-halation layer (colored layer).

Instead of using an image receiving material (described later), an image receiving layer can be provided on the image recording material to form an image on the image receiving layer. The structure of the image receiving layer provided on the image recording material can be the same as that of the image receiving material.

The process for the preparation of the image recording material is described below.

Various processes can be employed for preparing an image recording material. In a generally known process, an image recording material can be prepared by dissolving, emulsifying or dispersing each of the components of the image recording layer in an adequate solvent to obtain a coating solution, then applying the solution onto the aforementioned support, and drying the coated layer of the solution.

The coating solution can be generally prepared by preparing liquid compositions each composition containing each component and mixing those compositions with each other. Each of the liquid compositions may contain plural components. Some components of the image recording layer can be directly added to the coating solution or the liquid composition. Further, a secondary composition can be prepared by emulsifying the oily (or aqueous) composition in an aqueous (or oily) medium to obtain the coating solution.

Processes for the preparation of the liquid composition and the coating solution are described below.

The silver halide emulsion can be prepared by any known processes such as an acid process, a neutral process or an ammonia process.

In the stage for the preparation, a soluble silver salt and a soluble halogen salt can be reacted in accordance with a single jet process, a double jet process or a combination thereof. A reverse mixing method in which grains are formed in the presence of excess silver ions, or a controlled double jet process in which a pAg value is maintained constant, can be also employed. In order to accelerate grain growth, the concentrations or amounts of the silver salt and halogen salt to be added or the rate of their addition can be increased as described in Japanese Patent Provisional Publications No. 55(1980)-158124 and No. 55(1980)-158124 and U.S. Pat. No. 3,650,757.

The silver halide emulsion may be of a surface latent image type that forms a latent image predominantly on the surface of silver halide grains, or of an inner latent image type that forms a latent image predominantly in the inside of the grains. A direct reversal emulsion comprising an inner latent image type emulsion and a nucleating agent may be employed. The inner latent image type emulsion suitable for this purpose is described in U.S. Pat. Nos. 2,592,250 and 3,761,276, Japanese Patent Provisional Publication No. 58(1983)-3534 and Japanese Patent Publication No. 58(1983)-136641, etc. The nucleating agent that is preferably used in combination with the inner latent image type emulsion is described in U.S. Pat. Nos. 3,227,552, 4,245,037, 4,255,511, 4,266,013 and 4,276,364, and West German Patent Provisional Publication (OLS) No. 2,635,316.

In the preparation of the silver halide emulsion, various hydrophilic colloids are advantageously used as protective colloids. Examples of employable hydrophilic colloids include proteins (e.g., gelatin, gelatin derivatives, gelatin grafted with other polymers, albumin and casein), cellulose derivatives (e.g., hydroxyethyl cellulose and cellulose sulfate), saccharide derivatives (e.g., sodium alginate and starch derivative), and a wide variety of synthetic hydrophilic polymers, such as polyvinyl alcohol, polyvinyl alcohol partial acetal, poly-N-vinylpyrrolidone polyacrylic acid, polymethacrylic acid, polyacrylamide, polyvinylimidazole, and polyvinylpyrazole and copolymers comprising monomers constituting these homopolymers. Gelatin is most preferred. Examples of the employable gelatin include not only lime-treated gelatin but also acid-treated gelatin and enzyme-treated gelatin. Hydrolysis products or enzymatic decomposition products of gelatin can be also employed.

In the formation of silver halide grains in the silver halide emulsion, ammonia, an organic thioether derivative (see: Japanese Patent Publication No. 47(1972)-386) or sulfur-containing compound (see: Japanese Patent Provisional Publication No. 53(1987)-144319) can be used as a silver halide solvent. Further, in the grain formation or physical ripening, a cadmium salt, a zinc salt, a lead salt, a thallium salt, or the like can be introduced into the reaction system. Furthermore, for the purpose of improving high or low intensity reciprocity law failure, a water-soluble iridium salt, e.g., iridium (III) or (IV) chloride, or ammonium hexachloroiridate, or a water-soluble rhodium salt, e.g., rhodium chloride can be used.

After the grain formation or physical ripening, soluble salts may be removed from the resulting emulsion by a known noodle washing method or a sedimentation method. The silver halide emulsion may be used in the primitive condition, but is usually subjected to chemical sensitization. For the chemical sensitization of the emulsion employable for the image recording material, there can be employed sulfur sensitization, reduction sensitization or noble metal sensitization, etc, singly or in combination. Those chemical sensitization processes can be carried out in the presence of a nitrogen-containing heterocyclic compound as described in Japanese Patent Provisional Publications No. 58(1983)-126526 and No. 58(1983)-215644.

When a sensitizing dye is added to the silver halide emulsion, the sensitizing dye is preferably added during the stage of preparation of the emulsion. When the nitrogen-containing heterocyclic compound functioning as an antifogging agent and/or a development accerelator is added to the silver halide emulsion, the compound is preferably added during the stage of the formation or ripening of the silver halide grains.

When the organic silver salt is contained in the image recording layer, the emulsion of the organic silver salt can be prepared in the similar manner to that in the preparation of the silver halide emulsion.

In the preparation of the image recording material, the polymerizable compound can be used as a medium for the preparation of a liquid composition containing other components of the image recording layer. For example, the silver halide (including silver halide emulsion), the reducing agent of the present invention, the photopolymerization initiator, the color image forming substance or the like can be dissolved or emulsified in the polymerizable compound. Especially when the color image forming substance is used, the substance is preferably introduced into the polymerizable compound. Further, when the oily droplets of the polymerizable compound are made in the form of microcapsules, components of the shell material may be contained in the polymerizable compound.

A light-sensitive composition containing the polymerizable compound and silver halide can be prepared using the silver halide emulsion. Otherwise, a silver halide powder prepared by lyophilization can be also employed to prepare the light-sensitive composition. The light-sensitive composition can be obtained by stirring the polymerizable compound and the silver halide using a homogenizer, a blender, a mixer or another conventional stirring device.

Polymers having a principal chain consisting essentially of a hydrocarbon chain substituted in part with hydrophilic groups which contain, in their terminal groups, —OH or nitrogen having a lone pair of electrons are preferably introduced into the polymerizable compound prior to the preparation of the light-sensitive composition. The polymer has a function of dispersing silver halide or other component in the polymerizable compound very uniformly as well as a function of keeping thus dispersed state. Further, the polymer has another function of gathering silver halide along the interface between the polymerizable compound (i.e., light-sensitive composition) and the aqueous medium in preparation of the microcapsules. Therefore, using this polymer, silver halide can be easily introduced into the shell of the microcapsules.

The light-sensitive composition can be also prepared by dispersing microcapsules containing silver halide emulsion as a core material in the polymerizable compound instead of employing the above polymer.

The polymerizable compound or the above-mentioned light-sensitive composition which further contains other components is preferably employed in the form of an emulsion in which the compound or the composition is emulsified in an aqueous medium. In the case of preparing microcapsules containing the polymerizable compound, it is possible that the shell material required for the preparation of microcapsules is added to the emulsion and the emulsion is then subjected to a process for forming a shell of microcapsule. To the emulsion may be also added the reducing agent, the photopolymerization initiator or other optional components.

Examples of the processes for preparing microcapsules (encapsulation processes) include a process utilizing concervatior of a hydrophilic shell material as described in U.S. Pat. Nos. 2,800,457 and 2,800,458; an interface polymerization process as described in U.S. Pat. No. 3,287,154, British Patent No. 990,443, and Japanese Patent Publication Nos. 38(1963)-19574, 42(1967)-446 and 42(1967)-771; a polymer deposition process as described in U.S. Pat. Nos. 3,418,250 and 3,660,304; a process using an isocyanate-polyol shell material as described in U.S. Pat. No. 3,796,669; a process using an isocyanate shell material as described in U.S. Pat. No. 3,914,511; a process using an urea-formaldehyde or urea-formaldehyde-resorcinol shell material as described in U.S. Pat. Nos. 4,001,140, 4,087,376 and 4,089,80².; a process using a shell material such as melamine-formaldehyde resin or hydroxypropyl cellulose as described in U.S. Pat. No. 4,025,455; an in-situ process utilizing polymerization of monomers as described in Japanese Patent Publication No. 36(1961)-9168 and Japanese Patent Provisional Publication No. 51(1976)-9079; a polymerization-dispersion cooling process as described in U.K. Patent Nos. 927,807 and 965,074; and a spray-drying process as described in U.S. Pat. No. ,111,407 and U.K. Patent No. 930,422. The process for encapsulation is by no means restricted to the above-mentioned processes, but most preferred is a process comprising emulsifying a core material containing the polymerizable compound and then forming a polymer film as a shell of the microcapsule around the core material.

When the polymerizable compound is a light-sensitive composition containing the silver halide, the obtained emulsion of the polymerizable compound (including a microcapsule dispersion obtained by the above-mentioned process) can be employed per se as a coating solution for preparing an image recording material. When the light-sensitive composition does not contain the silver halide, the obtained emulsion can be mixed with other emulsions such as silver halide emulsion and an emulsion containing other optional component (e.g., organic silver salt) to prepare a coating solution. Other optional components can be also added to the coating solution.

The coating solution prepared as above is coated over a support, and the coated layer of the solution is dried to prepare an image recording material. Coating of the solution over the support can be readily performed by known processes.

The image receiving material employable in the image recording process of the present invention is described below.

As the support of the image receiving material, there can be employed a baryta paper in addition to various materials employable as the support of the image recording material. In the case that a porous material such as paper is employed as the support of the image receiving material, the porous support preferably has such a surface characteristic that a filtered maximum waviness of not less than 4 μm is observed in not more than 20 positions among 100 positions which are determined at random on a filtered waviness curve obtained according to JIS-B-0610. Further, a transparent material can be employed as the support of the image receiving material to obtain a transparent or a projected image.

The image receiving material is usually prepared by providing an image receiving layer on the support. The image receiving layer can be constructed using a variety of compounds according to the color formation system. In the cases that polymer image is formed on the image receiving material and that a dye or pigment is employed as the color image forming substance, the image receiving material can be composed of the support only.

For example, when a color formation system using a color former and a developer is employed, the developer can be contained in the image receiving layer. Otherwise, the image receiving layer can be composed of at least one layer containing a mordant. The mordant can be selected from various compounds which are known in the art of the conventional photography in consideration of nature of the color image forming substance. If desired, the image receiving layer can be composed of two or more layers containing a plurality of mordants different from each other in the mordanting power.

The image receiving layer preferably contains a polymer as a binder. The binder which is employable for the aforementioned image recording layer can be also employed for the image receiving layer. Further, a polymer having a low transmission coefficient of oxygen can be used as the binder.

The image receiving layer can contain a thermoplastic compound. In the case that the thermoplastic compound is contained in the image receiving layer, the image receiving layer itself is preferably composed of an agglomerate of fine particles of the thermoplastic compound (i.e., granulated thermoplastic compound). The image receiving layer having the above constitute has such advantages that the formation of a transferred image can be readily done and a glossy image can be obtained under heating after the image formation. The thermoplastic compound includes the known plastic resins and waxes. The thermoplastic resin preferably has a glass transition point of not more than 200° C.

The wax preferably has a melting point of not more than 200° C.

A photopolymerization initiator or a thermal polymerization initiator may be contained in the image receiving layer. In the image-formation process using an image receiving material, a color image forming substance is transferred together with the unpolymerized polymerizable compound as described hereinafter, so that the photopolymerization initiator or thermal polymerization initiator can be contained in the image receiving layer to smoothly perform the curing procedure (fixing procedure) of the unpolymerized polymerizable compound.

A dye or pigment can be contained in the image receiving layer for the purpose of entering letters, symbols, frames, etc. in the image receiving layer, or of giving a certain color to the background for the image. Further, the dye or pigment can be also employed for the purpose of making it easy to distinguish the sides of the image receiving material. As the dye of pigment, there can be employed a variety of known dyes or pigments employable for the image formation. However, in the case that the dye or pigment may disturb the image formed on the image receiving layer, it is preferred to make the density of the dye or pigment low (e.g., reflection density of not higher than 1), or to employ a dye or pigment having a property of being discolored when it is heated or irradiated with light.

Further, when a white pigment such as titanium dioxide and barium sulfate is contained in the image receiving layer, the image receiving layer can function as a white reflection layer. In this case, the white pigment is used in an amount of 10 to 100 g based on 1 g of the thermoplastic compound.

The above-mentioned dye and pigment can be either uniformly or partially contained in the image receiving layer. For example, when the support is composed of transparent material, the white pigment can be partially contained in the image receiving layer to make a part of a reflection image transparent. Thus, information of the image which is unnecessary in the transparent image can be entered in the part of the image receiving layer containing the white pigment as a reflection image.

The image receiving layer can be composed of two or more layers according to the above-mentioned functions. The thickness of the image receiving layer preferably ranges from 1 to 100 μm, more preferably from 1 to 20 μm.

A protective layer can be provided on the surface of the image receiving layer. A layer composed of an agglomerate of granulated thermoplastic compound can be also provided on the surface of the image receiving layer.

Further, a layer containing a self-adhesive or adhesive and a release paper can be laminated on the surface of the support not facing the image receiving layer to form a sticker type image receiving material.

The present invention is further described by the following examples without limiting the invention.

EXAMPLE 1

Preparation of Blue-Sensitive Silver Halide Emulsion (A-1)

In 1,500 ml of water were dissolved 16 g of gelatin and 0.5 g of sodium chloride, and the resulting gelatin solution was adjusted to pH 3.2 using 1N sulfuric acid and kept at 50° C. To the gelatin solution, 300 ml of aqueous solution containing 71 g of potassium bromide and 300 ml of aqueous solution containing 0.59 mole of silver nitrate were added simultaneously at the same feed rate over 50 minutes. After 1 minute, to the mixture was added 43 ml of 1% methanol solution of the following sensitizing dye (1). After 15 minutes, to the mixture, 100 ml of aqueous solution containing 2.9 g of potassium bromide and 100 ml of aqueous solution containing 0.018 mole of silver nitrate were added simultaneously at the same feed rate over 5 minutes. To the emulsion was added 1.2 g of isobutylene/monosodium maleate copolymer for sedimentation. The emulsion was washed with water for desalting. Then, 12 g of gelatin was dissolved in the emulsion. Further, 0.5 mg of sodium thiosulfate was added to the emulsion for chemical sensitization for 15 minutes to obtain a silver iodobromide emulsion (A-1) having tetradecahedral grains, uniform grain size distribution and average grain size of 0.22 μm. The yield of the emulsion was 1,000 g.

(Sensitizing dye (1))

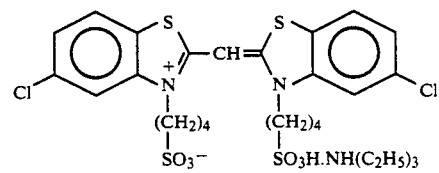

Preparation of Green-Sensitive Silver Halide Emulsion (A-2)

In 1,600 ml of water were dissolved 20 g of gelatin and 0.5 g of sodium chloride, and the resulting gelatin solution was adjusted to pH 3.2 using 1N sulfuric acid and kept at 42° C. To the gelatin solution, 200 ml of aqueous solution containing 71 g of potassium bromide and 200 ml of aqueous solution containing 0.59 mole of silver nitrate were added simultaneously at the same feed rate over 30 minutes. After 1 minute, to the mixture was added 48 ml of 1% methanol solution of the following sensitizing dye (2). After 10 minutes, to the mixture, 100 ml of aqueous solution containing 2.9 g of potassium bromide and 100 ml of aqueous solution containing 0.018 mole of silver nitrate were added simultaneously at the same feed rate over 5 minutes. To the emulsion was added 1.2 g of isobutylene/monosodium maleate copolymer for sedimentation. The emulsion was washed with water for desalting. Then, 18 g of gelatin was dissolved in the emulsion. Further, 0.7 mg of sodium thiosulfate was added to the emulsion for chemical sensitization at 60° C. for 15 minutes to obtain a silver iodobromide emulsion (A-2) having tetradecahedral grains, uniform grain size distribution and average grain size of 0.12 μm. The yield of the emulsion was 1,000 g.

(Sensitizing dye (2))

-continued

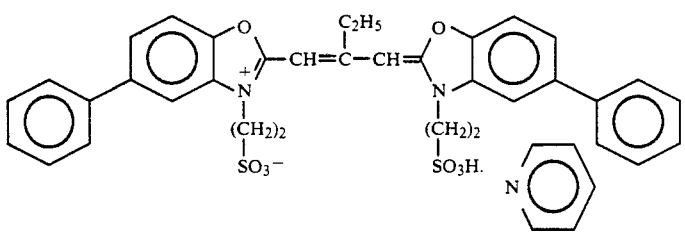

Preparation of Red-Sensitive Silver Halide Emulsion (A-3)

In 1,600 ml of water were dissolved 20 g of gelatin and 0.5 g of sodium chloride, and the resulting gelatin solution was adjusted to pH 3.5 using 1N sulfuric acid and kept at 45° C. To the gelatin solution, 200 ml of aqueous solution containing 71 g of potassium bromide and 200 ml of aqueous solution containing 0.59 mole of silver nitrate were added simultaneously at the same feed rate over 30 minutes. After 1 minute, to the mixture was added 48 ml of 0.5% methanol solution of the following sensitizing dye (3). After 15 minutes, to the mixture, 100 ml of aqueous solution containing 3.65 g of potassium bromide and 100 ml of aqueous solution containing 0.022 g of silver nitrate were added simultaneously at the same feed rate over 5 minutes. To the emulsion was added 1.2 g of isobutylene/monosodium maleate copolymer for sedimentation. The emulsion was washed with water for desalting. Then, 10 g of gelatin was dissolved in the emulsion. Further, 0.45 mg of sodium thiosulfate was added to the emulsion for chemical sensitization at 55° C. for 20 minutes to obtain a silver iodobromide emulsion (A-3) having tetradecahedral grains, uniform grain size distribution and average grain size of 0.13 μm. The yield of the emulsion was 1,000 g.

(Sensitizing dye (3))

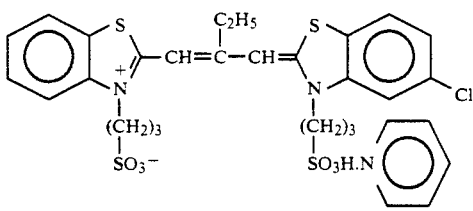

Preparation of Light-Sensitive Composition (B-1)

In 63 g of the following polymerizable compound (Kayarad R604 produced by Nippon Kayaku Co., Ltd.) were dissolved 0.77 g of the following copolymer, 0.36 g of p-toluenesulfonamide and 12.5 g of the following yellow color image forming substance. In the solution were dissolved 3.81 g of the following reducing agent (1), 0.09 g of the following development inhibitor-releasing precursor, 4.71 g of the following photopolymerization initiator (Irgacure 651 produced by Ciba-Geigy), 0.01 g of the following antifogging agent, 1.8 g of Emulex NP-8 (tradename of Nippon Emulsion Co., Ltd.) and 20 g of methylene chloride. The resulting solution was made uniform.

To 15 g of the above-prepared silver halide emulsion (A-1) was added 1.5 ml of 10% aqueous solution of potassium bromide. To the mixture was further added 0.08 weight % 1-methoxy-2-methylpropanol solution of the following development accelerator. The resulting mixture was stirred for 5 minutes. The mixture containing the silver halide emulsion (A-1) was added to the above-prepared uniform solution, and the resulting mixture was stirred at 15,000 r.p.m. for 5 minutes using a homogenizer to obtain a light-sensitive composition (B-1), which is in the state of a W/O emulsion.

(Polymerizable compound)

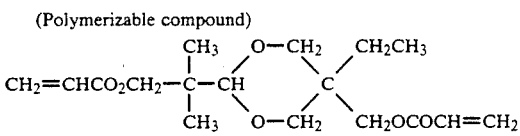

(Copolymer)

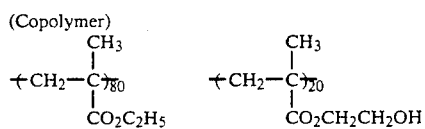

(Yellow color image forming substance)

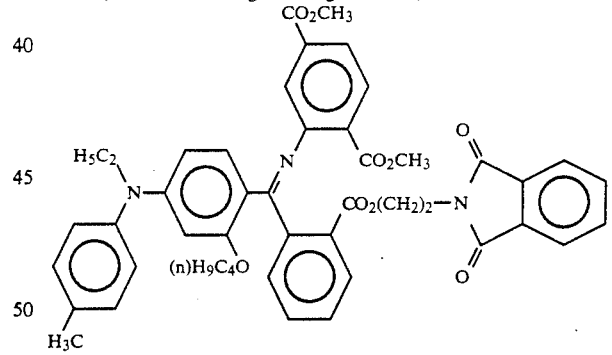

(Reducing agent (1))

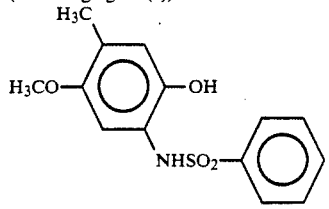

(Photopolymerization initiator)

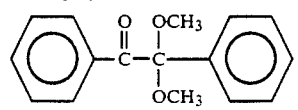

(Development inhibitor-releasing precursor)

-continued

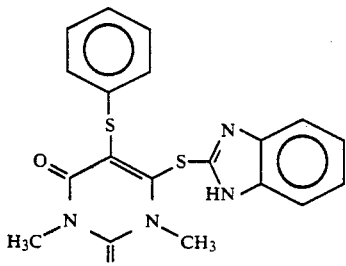

(Antifogging agent)

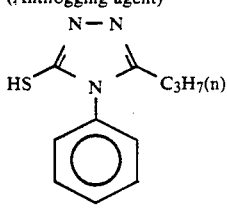

(Development accelerator)

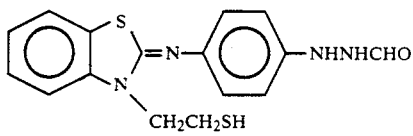

Preparation of Light-Sensitive Microcapsule Dispersion (C-1)

Using 10% aqueous solution of sodium hydroxide, 210 g of 10% aqueous solution of sodium salt of polyvinylbenzene sulfonic acid (Versa TL502 produced by National Starch, Co.) was adjusted to pH 6.0.

To the light-sensitive composition (B-1) was added 4.5 g of a polyisocyanate compound (Takenate D110N produced by Takeda Chemical Industries Ltd.). The resulting mixture was added to the above-prepared aqueous solution.

The mixture was stirred at 9,000 r.p.m. for 30 minutes at 40° C. using a homogenizer to obtain a W/O/W emulsion.

Separately, to 13.2 g of melamine was added 21.6 g of 37% aqueous solution of formaldehyde and 70 g of distilled water, and the resulting mixture was stirred at 60° C. for 30 minutes to obtain a transparent solution of melamine formaldehyde precondensate.

To the above-prepared W/O/W emulsion was added 77 g of the solution of the precondensate, and the resulting mixture was adjusted to pH 6.0 using 20% aqueous solution of phosphoric acid. The mixture was then heated to 60° C. and stirred for 120 minutes. To the mixture was added 27 g of 40% aqueous solution of urea, and the resulting mixture was adjusted to pH 3.5 using 20% aqueous solution of phosphoric acid. The mixture was stirred for 40 minutes. The mixture was then adjusted to pH 6.5, and cooled to room temperature to obtain a dispersion of light-sensitive microcapsule dispersion (C-1).

Preparation of Light-Sensitive Compositions (B-2) and (B-3)

Light-sensitive compositions (B-2) and (B-3) were prepared in the same manner as in the preparation of the light-sensitive composition (B-1) except that the silver halide emulsion, the amount of the antifogging agent and the color image forming substance were changed according to the following Table 1.

TABLE 1

| Light-sensitive Composition | Silver Halide Emulsion | Amount of Antifogging Agent | Color Image Forming Substance | |
|---|---|---|---|---|
| | | | Hue | Amount |
| (B-1) | (A-1) | 0.01 g | Yellow | 12.5 g |
| (B-2) | (A-2) | 0.015 g | Magenta | 20 g |
| (B-3) | (A-3) | 0.0075 g | Cyan | 16 g |

(Magenta color image forming substance)

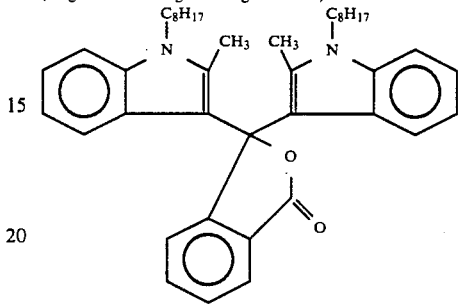

(Cyan color image forming substance)

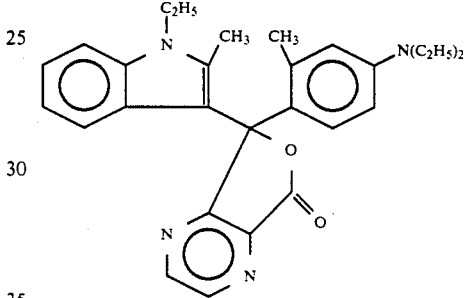

Preparation of Light-Sensitive Microcapsule Dispersion (C-2)

A light-sensitive microcapsule dispersion (C-2) was prepared in the same manner as in the preparation of the light-sensitive microcapsule dispersion (C-1) except that the light-sensitive composition (B-2) was used in place of the light-sensitive composition (B-1).

Preparation of Light-Sensitive Microcapsule Dispersion (C-3)

A light-sensitive microcapsule dispersion (C-3) was prepared in the same manner as in the preparation of the light-sensitive microcapsule dispersion (C-1) except that the light-sensitive composition (B-3) was used in place of the light-sensitive composition (B-1).

Preparation of Dispersion of Base Precursor

To 80 g of 4% aqueous solution of polyvinyl alcohol (PVA205 produced by Kuraray Co., Ltd.) was added 20 g of the following base precursor. The mixture was stirred at 40° C. in Dynomill dispersing device to obtain a dispersion of the base precursor, in which the average grain size of the base precursor is 2 μm.

(Base precursor)

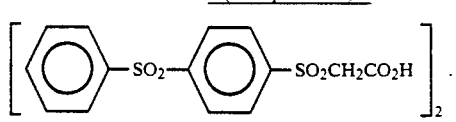

-continued
(Base precursor)

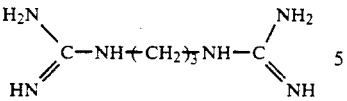

Preparation of Image Recording Material

A mixture comprising 16 g of the light-sensitive microcapsule dispersion (C-1), 18.5 g of the microcapsule dispersion (C-2), 14.8 g of the microcapsule dispersion (C-3), 6.8 g of the dispersion of the base precursor, 9 ml of 20% aqueous solution of sorbitol and 10 ml of 10% aqueous solution of starch was prepared. To the mixture was added 4 ml of 5% aqueous solution of the following surface active agent and water to prepare 74 g of the coating solution for the image recording layer.

The coating solution was coated over a colored coated paper having basis weight of 60 g in coating amount of 50 g/m². The coated layer was dried at about 60° C. to prepare an image recording material (A).

(Surface active agent)

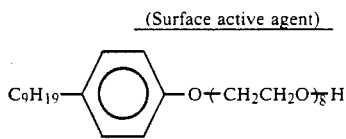

EXAMPLE 2

An image recording material (B) was prepared in the same manner as in the Example 1 except that 3.52 g of the following reducing agent (2) was used in place of 3.81 g of the reducing agent (1).

(Reducing agent (2))

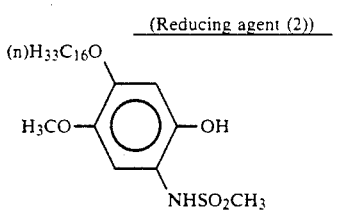

EXAMPLE 3

An image recording material (C) was prepared in the same manner as in the Example 1 except that 4.36 g of the following reducing agent (3) was used in place of 3.81 g of the reducing agent (1).

(Reducing agent (3))

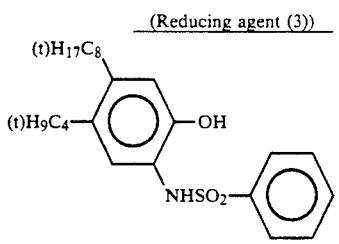

EXAMPLE 4

An image recording material (D) was prepared in the same manner as in the Example 1 except that 7.83 g of the following reducing agent (4) was used in place of 3.81 g of the reducing agent (1).

(Reducing agent (4))

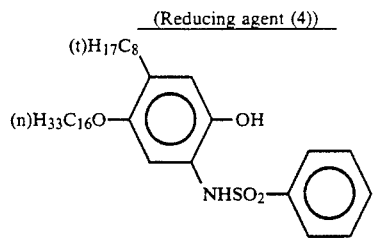

EXAMPLE 5

An image recording material (E) was prepared in the same manner as in the Example 1 except that 6.97 g of the following reducing agent (12) was used in place of 3.81 g of the reducing agent (1).

(Reducing agent (12))

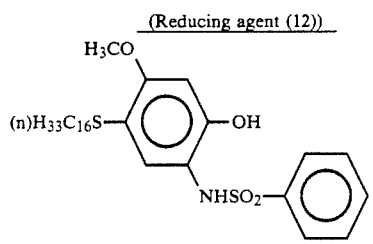

EXAMPLE 6

An image recording material (F) was prepared in the same manner as in the Example 1 except that 8.45 g of the following reducing agent (16) was used in place of 3.81 g of the reducing agent (1).

(Reducing agent (16))

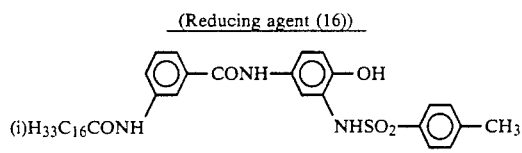

EXAMPLE 7

An image recording material (G) was prepared in the same manner as in the Example 1 except that 6.36 g of the following reducing agent (20) was used in place of 3.81 g of the reducing agent (1).

(Reducing agent (20))

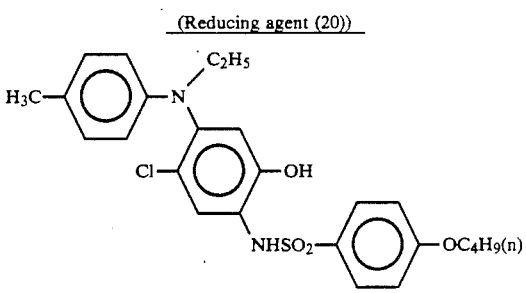

EXAMPLE 8

An image recording material (H) was prepared in the same manner as in the Example 1 except that 6.58 g of the following reducing agent (21) was used in place of 3.81 g of the reducing agent (1).

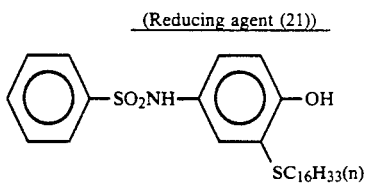
(Reducing agent (21))

EXAMPLE 9

An image recording material (I) was prepared in the same manner as in the Example 1 except that 10.8 g of the following reducing agent (25) was used in place of 3.81 g of the reducing agent (1).

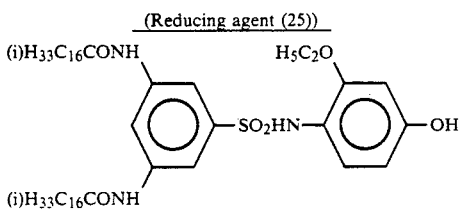
(Reducing agent (25))

COMPARISON EXAMPLE 1

An image recording material (b) was prepared in the same manner as in the Example 1 except that 2.29 g of the following reducing agent (b) was used in place of 3.81 g of the reducing agent (1).

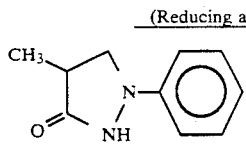
(Reducing agent (b))

COMPARISON EXAMPLE 2

An image recording material (c) was prepared in the same manner as in the Example 1 except that 2.32 g of the following reducing agent (c) was used in place of 3.81 g of the reducing agent (1).

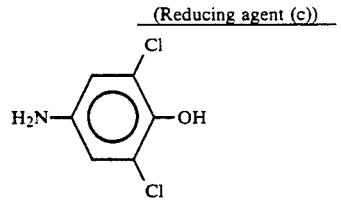
(Reducing agent (c))

COMPARISON EXAMPLE 3

An image recording material (d) was prepared in the same manner as in the Example 1 except that 1.43 g of the following reducing agent (d) was used in place of 3.81 g of the reducing agent (1).

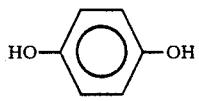
(Reducing agent (d))

COMPARISON EXAMPLE 4

An image recording material (e) was prepared in the same manner as in the Example 1 except that 1.61 g of the following reducing agent (e) was used in place of 3.81 g of the reducing agent (1).

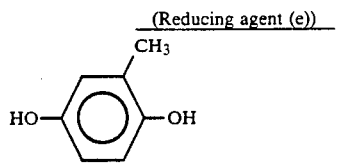
(Reducing agent (e))

COMPARISON EXAMPLE 5

An image recording material (f) was prepared in the same manner as in the Example 1 except that 3.61 g of the following reducing agent (f) was used in place of 3.81 g of the reducing agent (1).

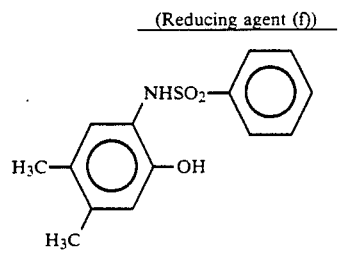
(Reducing agent (f))

COMPARISON EXAMPLE 6

An image recording material (g) was prepared in the same manner as in the Example 1 except that 5.35 g of the following reducing agent (g) was used in place of 3.81 g of the reducing agent (1).

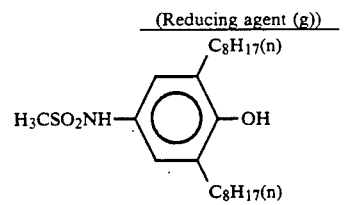
(Reducing agent (g))

Preparation of Image Receiving Material

To 125 g of water was added 11 g of 40% aqueous solution of sodium hexametaphosphate, and to the mixture were further added 34 g of zinc 3,5-di-α-methylbenzylsalicylate and 82 g of 55% slurry of calcium carbonate, followed by coarsely dispersing in a mixer. The resulting coarse dispersion was then finely dispersed in Dynomill dispersing device. To 200 g of the resulting dispersion were added 6 g of 50% latex of SBR and 55 g of 8% aqueous solution of polyvinyl alcohol, and the resulting mixture was made uniform to give a coating solution for an image receiving layer. The coating solution was uniformly coated on a paper having basis weight of 55 g/m² to give a coating layer having wet thickness of 30 μm. The coated layer was dried to prepare an image receiving material.

Image Formation and Evaluation Thereof

Each of the image recording materials (A) to (I) and (b) to (g) was imagewise exposed to light using a halogen lamp at 2,000 lux for 1 second through a continuous gray filter in which the transmission density is continuously changed from 0 to 3.0, and was heated at 155° C. for heat development. Each of the image recording materials was uniformly exposed to light using a halogen lamp at 50,000 lux for 30 seconds. Each of the image recording materials was then combined with the image receiving material and they were pressed through a press roller at pressure of 500 kg/cm² to obtain a negative color image on the image receiving material. The maximum density (Dmax) and the minimum density (Dmin) of the image with respect to the three hues (yellow, magenta and cyan) were measured using Macbeth reflection densitometer. The results are set forth in Table 2.

TABLE 2

| Recording | Yellow | | Magenta | | Cyan | |
|---|---|---|---|---|---|---|
| Material | Dmax | Dmin | Dmax | Dmin | Dmax | Dmin |
| (A) | 1.22 | 0.11 | 1.25 | 0.09 | 1.09 | 0.11 |
| (B) | 1.23 | 0.12 | 1.24 | 0.09 | 1.20 | 0.10 |
| (C) | 1.21 | 0.12 | 1.23 | 0.10 | 1.21 | 0.11 |
| (D) | 1.22 | 0.11 | 1.24 | 0.11 | 1.21 | 0.10 |
| (E) | 1.24 | 0.13 | 1.24 | 0.09 | 1.22 | 0.11 |
| (F) | 1.23 | 0.13 | 1.23 | 0.09 | 1.20 | 0.10 |
| (G) | 1.20 | 0.11 | 1.22 | 0.11 | 1.19 | 0.09 |
| (H) | 1.23 | 0.10 | 1.25 | 0.10 | 1.21 | 0.09 |
| (I) | 1.23 | 0.11 | 1.23 | 0.10 | 1.21 | 0.10 |
| (b) | 1.06 | 0.10 | 1.04 | 0.11 | 1.02 | 0.10 |
| (c) | 1.09 | 0.11 | 1.06 | 0.11 | 1.07 | 0.09 |
| (d) | 1.09 | 0.12 | 1.04 | 0.10 | 1.05 | 0.11 |
| (e) | 1.08 | 0.11 | 1.05 | 0.09 | 1.05 | 0.11 |
| (f) | 1.09 | 0.11 | 1.06 | 0.10 | 1.06 | 0.10 |
| (g) | 1.07 | 0.10 | 1.05 | 0.11 | 1.01 | 0.09 |

Separately, each of the image recording materials was preserved at 40° C. and at relative humidity of 80% for 8 days. Images were then formed from the preserved image recording materials and evaluated in the same manner as is described above. The results are set forth in Table 3.

TABLE 3

| Recording | Yellow | | Magenta | | Cyan | |
|---|---|---|---|---|---|---|
| Material | Dmax | Dmin | Dmax | Dmin | Dmax | Dmin |
| (A) | 1.16 | 0.10 | 1.21 | 0.07 | 1.17 | 0.10 |
| (B) | 1.15 | 0.11 | 1.21 | 0.09 | 1.16 | 0.09 |
| (C) | 1.18 | 0.11 | 1.22 | 0.07 | 1.15 | 0.08 |
| (D) | 1.19 | 0.10 | 1.21 | 0.09 | 1.16 | 0.10 |
| (E) | 1.20 | 0.11 | 1.23 | 0.10 | 1.20 | 0.11 |
| (F) | 1.21 | 0.12 | 1.20 | 0.11 | 1.18 | 0.10 |
| (G) | 1.20 | 0.10 | 1.21 | 0.10 | 1.18 | 0.11 |
| (H) | 1.22 | 0.11 | 1.23 | 0.10 | 1.20 | 0.09 |
| (I) | 1.20 | 0.11 | 1.22 | 0.09 | 1.19 | 0.10 |
| (b) | 0.41 | 0.10 | 0.37 | 0.12 | 0.50 | 0.11 |
| (c) | 0.40 | 0.10 | 0.29 | 0.11 | 0.41 | 0.09 |
| (d) | 0.37 | 0.11 | 0.40 | 0.12 | 0.35 | 0.10 |
| (e) | 0.44 | 0.13 | 0.41 | 0.10 | 0.42 | 0.09 |
| (f) | 0.46 | 0.11 | 0.43 | 0.11 | 0.43 | 0.11 |
| (g) | 0.50 | 0.12 | 0.47 | 0.12 | 0.51 | 0.10 |

It is apparent from the results shown in Table 2 that each of the image recording materials gives a very clear image.

It is further apparent from the results shown in Table 3 that each of the image recording materials (A) to (I) of the present invention containing a reducing agent represented by the formula [I] gives a clear image, even if the material is preserved under a severe condition.

EXAMPLE 10

Preparation of Image Recording Material

To 28 g of water were added 17 g of the light-sensitive microcapsule dispersion (C-1) used in Example 1, 17 g of the microcapsule dispersion (C-2) used in Example 1, 17 g of the microcapsule dispersion (C-3) used in Example 1, 6 ml of 10% aqueous solution of gelatin, 6 ml of 5% aqueous solution of the surface active agent used in Example 1 and 7.3 g of 10% aqueous dispersion of zinc hydroxide to prepare a coating solution for the image recording layer.

The coating solution was coated over a polyethylene terephthalate sheet having thickness of 100 μm to give a coating layer having wet thickness of 50 μm. The coated layer was dried to prepare an image recording material (J).

EXAMPLE 11

An image recording material (K) was prepared in the same manner as in the Example 10 except that 3.52 g of the reducing agent (2) used in Example 2 was used in place of the reducing agent (1).

EXAMPLE 12

An image recording material (L) was prepared in the same manner as in the Example 10 except that 4.36 g of the reducing agent (3) used in Example 3 was used in place of the reducing agent (1).

EXAMPLE 13

An image recording material (M) was prepared in the same manner as in the Example 10 except that 7.83 g of the reducing agent (4) used in Example 4 was used in place of the reducing agent (1).

EXAMPLE 14

An image recording material (N) was prepared in the same manner as in the Example 10 except that 6.97 g of the reducing agent (12) used in Example 5 was used in place of the reducing agent (1).

EXAMPLE 15

An image recording material (O) was prepared in the same manner as in the Example 10 except that 8.45 g of the reducing agent (16) used in Example 6 was used in place of the reducing agent (1).

EXAMPLE 16

An image recording material (P) was prepared in the same manner as in the Example 10 except that 6.36 g of the reducing agent (20) used in Example 7 was used in place of the reducing agent (1).

EXAMPLE 17

An image recording material (Q) was prepared in the same manner as in the Example 10 except that 6.58 g of the reducing agent (21) used in Example 8 was used in place of the reducing agent (1).

EXAMPLE 18

An image recording material (R) was prepared in the same manner as in the Example 10 except that 10.8 g of the reducing agent (25) used in Example 9 was used in place of the reducing agent (1).

COMPARISON EXAMPLE 7

An image recording material (h) was prepared in the same manner as in the Example 10 except that 2.29 g of the reducing agent (b) used in Comparison Example 1 was used in place of the reducing agent (1).

COMPARISON EXAMPLE 8

An image recording material (i) was prepared in the same manner as in the Example 10 except that 2.32 g of the reducing agent (c) used in Comparison Example 2 was used in place of the reducing agent (1).

COMPARISON EXAMPLE 9

An image recording material (j) was prepared in the same manner as in the Example 10 except that 1.43 g of the reducing agent (d) used in Comparison Example 3 was used in place of the reducing agent (1).

COMPARISON EXAMPLE 10

An image recording material (k) was prepared in the same manner as in the Example 10 except that 1.61 g of the reducing agent (e) used in Comparison Example 4 was used in place of the reducing agent (1).

COMPARISON EXAMPLE 11

An image recording material (l) was prepared in the same manner as in the Example 10 except that 3.61 g of the reducing agent (f) used in Comparison Example 5 was used in place of the reducing agent (1).

COMPARISON EXAMPLE 12

An image recording material (m) was prepared in the same manner as in the Example 10 except that 5.35 g of the reducing agent (g) used in Comparison Example 6 was used in place of the reducing agent (1).

Preparation of Base Forming Sheet

To 45 ml of water were added 27 g of 10% aqueous solution of gelatin, 3.2 g of guanidine picolinate, 17 ml of 5% aqueous solution of dextran, 5 ml of 5% aqueous solution of the surface active agent used in Example 1 and 2 ml of 2% aqueous solution of 1,2-bis(vinylsulfonylacetamide)ethane. The mixture was coated over a polyethylene terephthalate sheet having thickness of 100 μm to give a coating layer having wet thickness of 70 μm. The coated layer was dried at about 40° C. to prepare a base forming sheet.

Image Formation and Evaluation Thereof

Each of the image recording materials (J) to (R) and (h) to (m) was imagewise exposed to light using a halogen lamp at 2,000 lux for 1 second through a continuous gray filter in which the transmission density is continuously changed from 0 to 3.0. Water was coated on the surface of the image recording layer in coating amount of 10 g/m². Each of the image recording materials was then combined with the base forming sheet and they were heated at 85° C. for 10 seconds in a heating apparatus having a conveyor belt and a roller.

The base forming sheet was removed from the image recording material. Each of the image recording materials was uniformly exposed to light using a halogen lamp at 50,000 lux for 30 seconds. Each of the image recording materials was then combined with the image receiving material and they were pressed through a press roller at pressure of 500 kg/cm² to obtain a negative color image on the image receiving material. The maximum density (Dmax) and the minimum density (Dmin) of the image with respect to the three hues (yellow, magenta and cyan) were measured using Macbeth reflection densitometer. The results are set forth in Table 4.

TABLE 4

| Recording | Yellow | | Magenta | | Cyan | |
| Material | Dmax | Dmin | Dmax | Dmin | Dmax | Dmin |
| --- | --- | --- | --- | --- | --- | --- |
| (J) | 1.23 | 0.10 | 1.26 | 0.09 | 1.22 | 0.09 |
| (K) | 1.24 | 0.12 | 1.24 | 0.09 | 1.21 | 0.10 |
| (L) | 1.23 | 0.09 | 1.24 | 0.10 | 1.22 | 0.11 |
| (M) | 1.22 | 0.12 | 1.25 | 0.11 | 1.24 | 0.11 |
| (N) | 1.21 | 0.11 | 1.26 | 0.10 | 1.21 | 0.12 |
| (O) | 1.23 | 0.11 | 1.24 | 0.10 | 1.20 | 0.10 |
| (P) | 1.25 | 0.12 | 1.23 | 0.11 | 1.21 | 0.11 |
| (Q) | 1.25 | 0.11 | 1.25 | 0.10 | 1.22 | 0.09 |
| (R) | 1.27 | 0.12 | 1.26 | 0.09 | 1.19 | 0.09 |
| (h) | 1.05 | 0.09 | 1.11 | 0.09 | 1.21 | 0.09 |
| (i) | 1.06 | 0.10 | 1.01 | 0.11 | 1.22 | 0.09 |
| (j) | 1.05 | 0.11 | 1.06 | 0.12 | 1.20 | 0.11 |
| (k) | 1.07 | 0.11 | 1.07 | 0.11 | 1.20 | 0.12 |
| (l) | 1.06 | 0.12 | 1.11 | 0.10 | 1.19 | 0.09 |
| (m) | 1.04 | 0.11 | 1.12 | 0.10 | 1.17 | 0.09 |

Separately, each of the image recording materials was preserved at 40° C. and at relative humidity of 80% for 8 days. Images were then formed from the preserved image recording materials and evaluated in the same manner as is described above. The results are set forth in Table 5.

TABLE 5

| Recording | Yellow | | Magenta | | Cyan | |
| Material | Dmax | Dmin | Dmax | Dmin | Dmax | Dmin |
| --- | --- | --- | --- | --- | --- | --- |
| (J) | 1.21 | 0.10 | 1.26 | 0.10 | 1.21 | 0.10 |
| (K) | 1.22 | 0.11 | 1.23 | 0.10 | 1.21 | 0.09 |
| (L) | 1.21 | 0.10 | 1.23 | 0.10 | 1.22 | 0.10 |
| (M) | 1.20 | 0.10 | 1.24 | 0.09 | 1.23 | 0.11 |
| (N) | 1.20 | 0.10 | 1.25 | 0.09 | 1.20 | 0.11 |
| (O) | 1.21 | 0.11 | 1.24 | 0.11 | 1.19 | 0.12 |
| (P) | 1.23 | 0.11 | 1.21 | 0.12 | 1.20 | 0.09 |
| (Q) | 1.24 | 0.10 | 1.23 | 0.10 | 1.20 | 0.09 |
| (R) | 1.26 | 0.11 | 1.25 | 0.10 | 1.17 | 0.10 |
| (h) | 0.55 | 0.10 | 0.49 | 0.09 | 0.52 | 0.09 |
| (i) | 0.35 | 0.10 | 0.37 | 0.12 | 0.39 | 0.11 |
| (j) | 0.31 | 0.11 | 0.35 | 0.11 | 0.36 | 0.12 |
| (k) | 0.44 | 0.11 | 0.45 | 0.12 | 0.35 | 0.10 |
| (l) | 0.43 | 0.12 | 0.46 | 0.11 | 0.31 | 0.11 |
| (m) | 0.33 | 0.13 | 0.30 | 0.10 | 0.40 | 0.09 |

It is apparent from the results shown in Table 4 that each of the image recording materials gives a very clear image.

It is further apparent from the results shown in Table 5 that each of the image recording materials (J) to (K) of the present invention containing a reducing agent represented by the formula [I] gives a clear image, even if the material is preserved under a severe condition.

We claim:

1. An image recording process comprising the steps of:

imagewise exposing silver halide to light to form a latent image of the silver halide; developing the formed latent image of the silver halide with a reducing agent; and conducting substantially uniform light exposure in the presence of a photopolymerization initiator and an ethylenically unsaturated polymerizable compound to form a polymer image, wherein the reducing agent forms an oxidation product having a function as a polymerization inhibitor for the polymerizable compound after the development, whereby the polymer image is formed within the area where the oxidation product of the reducing agent has not been formed, said reducing agent having the following formula [I]:

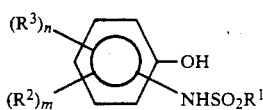

in which $R^1$ is a monovalent group selected from the group consisting of an alkyl group, an aryl group and a heterocyclic group, each of which may have one or more substituent groups; $R^2$ is an organic group which is attached to the benzene ring by a heteroatom having a lone pair of electrons; $R^3$ is a monovalent group selected from the group consisting of a halogen atom, an alkyl group, an aryl group and a heterocyclic group, each of which may have one or more substituent groups; m is 1, 2, 3 or 4; n is an integer satisfying the formula, $0 \leq n \leq (4-m)$; and an aromatic ring, an aliphatic ring and/or a heterocyclic ring may be condensed with the benzene ring, wherein the silver halide is contained in the image recording layer in an amount of 0.1 mg/m² to 10 g/m² in terms of silver contained in the silver halide, the reducing agent is used in an amount of 0.1 to 1,500 mole % based on 1 mole of silver contained in the silver halide, the photopolymerization initiator is contained in the image recording layer in an amount of 0.0001 mole to 0.1 mole based on 1 mole of the ethylenically unsaturated polymerizable compound, and the ethylenically unsaturated polymerizable compound is contained in the image recording layer in an amount of 5 to 120,000 parts by weight per one part by weight of the silver halide, and wherein the silver halide, the reducing agent, the photopolymerization initiator and the ethylenically unsaturated polymerizable compound are contained in an image recording layer of an image recording material, said image recording layer being provided on a support.

2. The image recording process as claimed in claim 1, wherein $R^2$ in the formula [I] is a monovalent group having the following formula [II]:

$$—(VIB)—R^4 \quad [II]$$

in which (VIB) is a divalent group selected from the group consisting of oxygen, sulfur and selenium; and $R^4$ is a monovalent group selected from the group consisting of an alkyl group, an aryl group and a heterocyclic group, each of which may have one or more substituent groups.

3. The image recording process as claimed in claim 1, wherein $R^2$ in the formula [I] is a monovalent group having the following formula [III]:

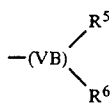

in which (VB) is a trivalent group consisting of nitrogen or phosphorus; $R^5$ is a monovalent group selected from the group consisting of hydrogen, an alkyl group, an aryl group and a heterocyclic group, each of which may have one or more substituent groups; and $R^6$ is a monovalent group selected from the group consisting of an alkyl group, an aryl group, a heterocyclic group, an acyl group, an alkylsulfonyl group, an arylsulfonyl group, an alkoxycarbonyl group, carbamoyl and sulfamoyl, each of which may have one or more substituent groups.

4. The image recording process as claimed in claim 1, wherein the quantity of light at the imagewise exposure to silver halide is in the range of $10^{-2}$ to $10^4$ cms.

5. The image recording process as claimed in claim 1, wherein the latent image of the silver halide is developed by heating.

6. The image recording process as claimed in claim 5, wherein the temperature of heating is in the range of 80° C. to 200° C.

7. The image recording process as claimed in claim 1, wherein the quantity of light at the uniform exposure for forming the polymer image is in the range of $10^3$ to $10^8$ erg/cm².

8. The image recording process as claimed in claim 1, wherein after the uniform exposure for forming a polymer image, the image recording material is pressed on an image receiving material to transfer the unpolymerized polymerizable compound to the image receiving material.

9. The image recording process as claimed in claim 1, wherein the silver halide, the reducing agent, the photopolymerization initiator and the ethylenically unsaturated polymerizable compound are contained in microcapsules which are dispersed in the image recording layer.

* * * * *